United States Patent
Otsuka

(10) Patent No.: US 8,407,405 B2
(45) Date of Patent: Mar. 26, 2013

(54) SEMICONDUCTOR STORAGE DEVICE WITH A PLURALITY OF MEMORIES DIVIDED INTO GROUPS AND A CONTROLLER THAT PERFORMS WRITE CONTROL BY INTERLEAVING DATA BETWEEN THE GROUPS

(75) Inventor: Takeshi Otsuka, Hyogo (JP)

(73) Assignee: Panasonic Corporation, Osaka (JP)

( * ) Notice: Subject to any disclaimer, the term of this patent is extended or adjusted under 35 U.S.C. 154(b) by 428 days.

(21) Appl. No.: 12/780,169

(22) Filed: May 14, 2010

(65) Prior Publication Data

US 2010/0325349 A1 Dec. 23, 2010

(30) Foreign Application Priority Data

May 15, 2009 (JP) ................................ 2009-118586

(51) Int. Cl.
*G06F 12/02* (2006.01)

(52) U.S. Cl. ................................ 711/103; 711/E12.008

(58) Field of Classification Search ........................ None
See application file for complete search history.

(56) References Cited

U.S. PATENT DOCUMENTS 5,422,856 A 6/1995 Sasaki et al.

FOREIGN PATENT DOCUMENTS

JP 6-259320 9/1994

*Primary Examiner* — Kevin Verbrugge

(74) *Attorney, Agent, or Firm* — Wenderoth, Lind & Ponack, L.L.P.

(57) ABSTRACT

A semiconductor storage device, includes a plurality of flash memories and a controller for the flash memories. The flash memory includes a data cache operable to hold data for at least one record page in writing, the flash memory includes a plurality of erasure blocks each having a plurality of record pages, the record page is classified into a first record page and a second record page of which write time is longer than a write time of the first record page, and the controller for the flash memories is configured to: divide the plurality of flash memories into at least two groups; perform write control by interleaving data in the groups for each record page; determine whether a page to be written data is of the first record page or the second record page; and when it is determined that the page to be written data is the first record page, after a lapse of a first predetermined time from start of writing data of one of the groups, the controller starts writing data of another one of the groups, and when it is determined that the page to be written data is the second record page, after a lapse of a second predetermined time being longer than the first predetermined time from start of writing data of one of the groups, the controller starts writing data of another one of the groups.

7 Claims, 16 Drawing Sheets

SEMICONDUCTOR STORAGE DEVICE WITH A PLURALITY OF MEMORIES DIVIDED INTO GROUPS AND A CONTROLLER THAT PERFORMS WRITE CONTROL BY INTERLEAVING DATA BETWEEN THE GROUPS

BACKGROUND

1. Technical Field

The technical field relates to a semiconductor storage device such as a memory card, and in particular, to a semiconductor storage device that guarantees its write speed by carrying out write processing to a plurality of flash memories (non-volatile memories) in parallel.

2. Related Art

Semiconductor storage devices such as SD (Secure Digital) cards, which are card-type recording media having built-in flash memories, are microminiature and microthin. Owing to their handleability, they have conventionally been in widespread use in applications such as digital cameras, mobile devices and the like, for recording data such as images.

As to the SD cards, Speed Classes are defined particularly for use in recording moving images. For example, Class 4 is able to guarantee a write performance of at least 4 MB/s under defined conditions of use.

The defined conditions of use will be described referring to FIG. 2. FIG. 2 shows an explanatory diagram illustrating the alignment of a data recording region in an SD card. As shown in the drawing, in an SD card, user data is defined as a group of AUs (Allocation Units); Wherein one AU is defined as continuous N pieces (where N is a natural number) of RUs (Recording Units). Accordingly, one AU is structured with N pieces of RUs, i.e., RU[0] to RU[N−1].

For example, in a case where RU=64 KB and one AU is structured with sixteen pieces of RUs, the AU is as great as 1 MB. A guarantee value of speed in a case where write processing is carried out to AU, starting from RU[0] to RU[15] in order, is defined as Pw (see SD Specifications Part 1).

Meanwhile, in broadcast and professional fields, images may be recorded with camera recorders having a flash memory. In addition to, an increase in the quality of the recorded image is highly required. In order to meet the requirement, the recording rate must be accelerated. Such fast recording can be realized by providing a plurality of flash memories in a semiconductor storage device, and carrying out write processing to the flash memories in parallel. However, carrying out write processing to a plurality of flash memories in parallel poses a problem of an increase in current consumption in writing.

As a technique that can cope with such a problem, a semiconductor storage device is disclosed in JP-A-6-259320. Specifically, the semiconductor storage device disclosed in JP-A-6-259320 is configured to shift, when carrying out write processing to a plurality of flash memories, the start timing of each write processing such that the write processing to each flash memory does not coincide with the others. Thus, an increase in power consumption is prevented.

Meanwhile, in recent years, the semiconductor storage devices are required to be increased in their capacity to meet an ever increase in size and numbers of write pages. In order to meet the requirement, multilevel flash memories capable of storing equal to or greater than two bits per cell have been commercialized.

FIG. 3 shows an example of the relationship between the number of electrons accumulated in the floating gate of such a multilevel flash memory and the threshold voltage (Vth). As shown in FIG. 3, in a four-level flash memory, the accumulation state of the electrons in the floating gate is managed by four states based on the threshold voltage (Vth). The threshold voltage is the lowest in an erasure state, which is associated with (1, 1). As the electrons accumulate, the threshold voltage discretely increases, the states thereof being associated with (1, 0), (0, 0) and (0, 1) respectively. In this manner, because the threshold voltage increases in proportion to the number of electrons accumulated, by performing control so as to be within a predetermined threshold voltage, it becomes possible to record 2-bit data in one memory cell.

FIG. 4 shows a schematic diagram of one erasure block of a four-level flash memory. The erasure block shown in FIG. 4 is structured with 2×K pages (where K is a natural number). A write process is carried out in ascending order from page number 0. Here, it is assumed that a page having an even page number (2×m is an integer satisfying the relationship $0 \leq m \leq (K-1)$) and a page having an odd page number (2×m+1) are in a relationship where they share one memory cell (hereinafter referred to as the cell sharing relationship). In the pages in the cell sharing relationship, the page to be written first is referred to as the 1st record page, and the page to be written next is referred to as the 2nd record page. That is to say, write processing to the page number (2×m) (write processing to the 1st record page) and write processing to the page number (2×m+1) (write processing to the 2nd record page) correspond to charging of electrons to an identical cell. Referring to FIG. 5 showing a state transition diagram of a flash memory cell, in write processing to the 1st record page, control is performed such that the threshold voltage rises only halfway, and in the next write processing to the 2nd record page, control is performed such that the threshold voltage rises to the maximum extent. That is to say, the state of one memory cell of a physical block of a flash memory transits as follows:

(a) the state of the memory cell after data erasure is (1, 1);

(b) the state of the cell after write processing is carried out to the 1st record page is (1, 1) or (1, 0); and (c) the state of the cell after write processing is carried out to the 2nd record page is (1, 1), (1, 0), (0, 0) or (0, 1).

Hence, write processing to the 2nd record page is carried out by the following four steps:

(c-1) determine whether or not the cell state (the charge state of electrons) immediately before write processing is (1, 0);

(c-2) if the determined cell state (the charge state of electrons) is (1, 0), then Charge electrons to be (1, 0)→(0, 0);

(c-3) determine whether or not the cell state (the charge state of electrons) is (1, 1); and (c-4) if the determined cell state (the charge state of electrons) is (1, 1), then charge electrons to be (1, 1)→(0, 1).

In the foregoing, (c-1) and (c-3) correspond to read processes, and (c-2) and (c-4) correspond to write processes.

Thus, in write processing to the 2nd record page, the read process and the write process may possibly be carried out for a plurality of times, which makes the write time of the 2nd record page longer than that of the 1st record page. Therefore, simply shifting the write start timing to the 2nd record page in a manner identical to a case of treating the 1st record page results in a time airing which write processing coincides with write processing to another flash memory. As a result, electric power for carrying out write processing to a plurality of flash memories is required. Accordingly, there is a problem that, when a plurality of multilevel flash memories for achieving fast recording are employed, the conventional technique cannot fully reduce the power consumption.

SUMMARY

The present invention has been made to solve the problem described above, and its object is to achieve the fastest possible recording while aiming to reduce the power consumption, in a semiconductor storage device including a plurality of multilevel flash memories.

In order to solve the problem, a semiconductor device according to a first aspect includes a plurality of flash memories; and a controller for the flash memories. The flash memory includes a data cache operable to hold data for at least one record page in writing, the flash memory includes a plurality of erasure blocks each having a plurality of record pages, and the record page is classified into a first record page (1st record page) and a second record page (2nd record page) of which write time is longer than a write time of the first record page. The controller for the flash memories is configured to: divide the plurality of flash memories into at least two groups; perform write control by interleaving data in the groups for each record page; determine whether a page to be written data is the first record page or the second record page; and when it is determined that the page to be written data is the first record page, after a lapse of a first predetermined time (T1) from start of writing data of one of the groups, the controller starts writing data of another one of the groups; and when it is determined that the page to be written data is the second record page, after a lapse of a second predetermined time (T2) being longer than the first predetermined time from start of writing data of one of the groups, the controller starts writing data of another one of the groups.

Further, when the number of the groups is two, the first predetermined time T1 is set to be equal to or smaller than half a maximum value Tw1 of the write time to the 1st record page in the flash memories, and the second predetermined time T2 is set to be equal to or smaller than half a maximum value Tw2 of the write time to the 2nd record page in the flash memories.

Still further, when the number of the groups is two, the first predetermined time T1 is set to be longer than a standard value Ta1 of the write time to the 1st record page in the flash memories, and the second predetermined time T2 is set to be longer than a standard value Ta2 of the write time to the 2nd record page in the flash memories.

A semiconductor storage device according to a second aspect includes: a plurality of flash memories; and a controller for the flash memories. The flash memory includes a data cache operable to hold data for at least one record page in writing, the flash memory includes a plurality of erasure blocks each having a' plurality of record pages, and the plurality of record pages each have a write time being different from one another. The controller for the flash memories is configured to: divide the plurality of flash memories into at least two flash memory groups; group the plurality of record pages into record page groups in accordance with a predetermined rule; perform write control by interleaving data in the flash memory groups for each record page group; and after a lapse of a write time for a group of a record page to be written data among the record page groups, starts writing data of another one of the flash memory groups.

With the semiconductor storage device according to the first aspect, when the controller for the flash memories determines that a page to be written data is the 1st record page, after a lapse of a first predetermined time T1 (hereinafter referred to as the first offset time T1) from start of writing data of one of the groups, the controller for the flash memories starts writing data of another one of the groups, when the controller for the flash memories determines that page to be written data is the 2nd record page, after a lapse of a second predetermined time T2 (hereinafter referred to as the second offset time T2) being longer than the first predetermined time from start of writing data of one of the groups, the controller for the flash memories starts writing data of another one of the groups.

Therefore, by setting the first offset value T1 for the start of writing data to be equal to or greater than the standard time required to writing data of the 1st record page, and setting the second offset value T2 for the start of writing data to be equal to or greater than the standard time required to writing data of the 2nd record page, in a case where the write time of the flash memories is equal to or smaller than the standard value, the flash memories respectively belonging to two groups do not undergo simultaneous writing data. This suppresses the power consumption. That is, the fastest possible recording can be achieved by using a plurality of multilevel flash memories, while aiming to reduce the power consumption. Here, the standard value of the write time is the expected write time with no conditions that hinder write processing.

Further, by setting the offset value T1 for the start time of writing data to be equal to or smaller than half the maximum value of the write time of the 1st record page, and setting the offset value T2 for the start time of writing data to be equal to or smaller than half the maximum value of the write time of the 2nd record page, even When the write time of the flash memories varies to the maximum value, the offset values T1 and T2 for the start time of writing data are cancelled by the write time of the flash memories, and hence the write speed of the semiconductor storage device will not be impaired by the offset values for the start times of writing data to become equal to or smaller than the guarantee value.

Still further, when the offset value T1 for the start time of writing data is equal to or greater than a value obtained by the standard value required to write data of the 1st record page added by a predetermined margin, and the offset value T2 for the start time of writing data is equal to or greater than a value obtained by the standard value required to write data of the 2nd record page added by a predetermined margin, the flash memories respectively belonging to two groups rarely undergo simultaneous writing data. That is, the power consumption can be suppressed while the write speed of the semiconductor storage device is prevented from becoming equal to or smaller than the guarantee value.

With the semiconductor storage device according to the second aspect, the controller for the flash memories is configured to: divide the plurality of flash memories into at least two flash memory groups; group the plurality of record pages into record page groups in accordance with a predetermined rule; perform write control by interleaving data in the flash memory groups for each record page group; and after a lapse of a write time for a group of a record page to be written data among the record page groups, starts writing data of another one of the flash memory groups. Accordingly, the flash memories respectively belonging to different groups do not undergo simultaneous writing data, whereby the power consumption can be suppressed. That is, the fastest possible recording can be achieved by using a plurality of multilevel flash memories, while aiming to reduce the power consumption.

DETAILED DESCRIPTION OF PREFERRED EMBODIMENT (First Embodiment)

Figure 1:
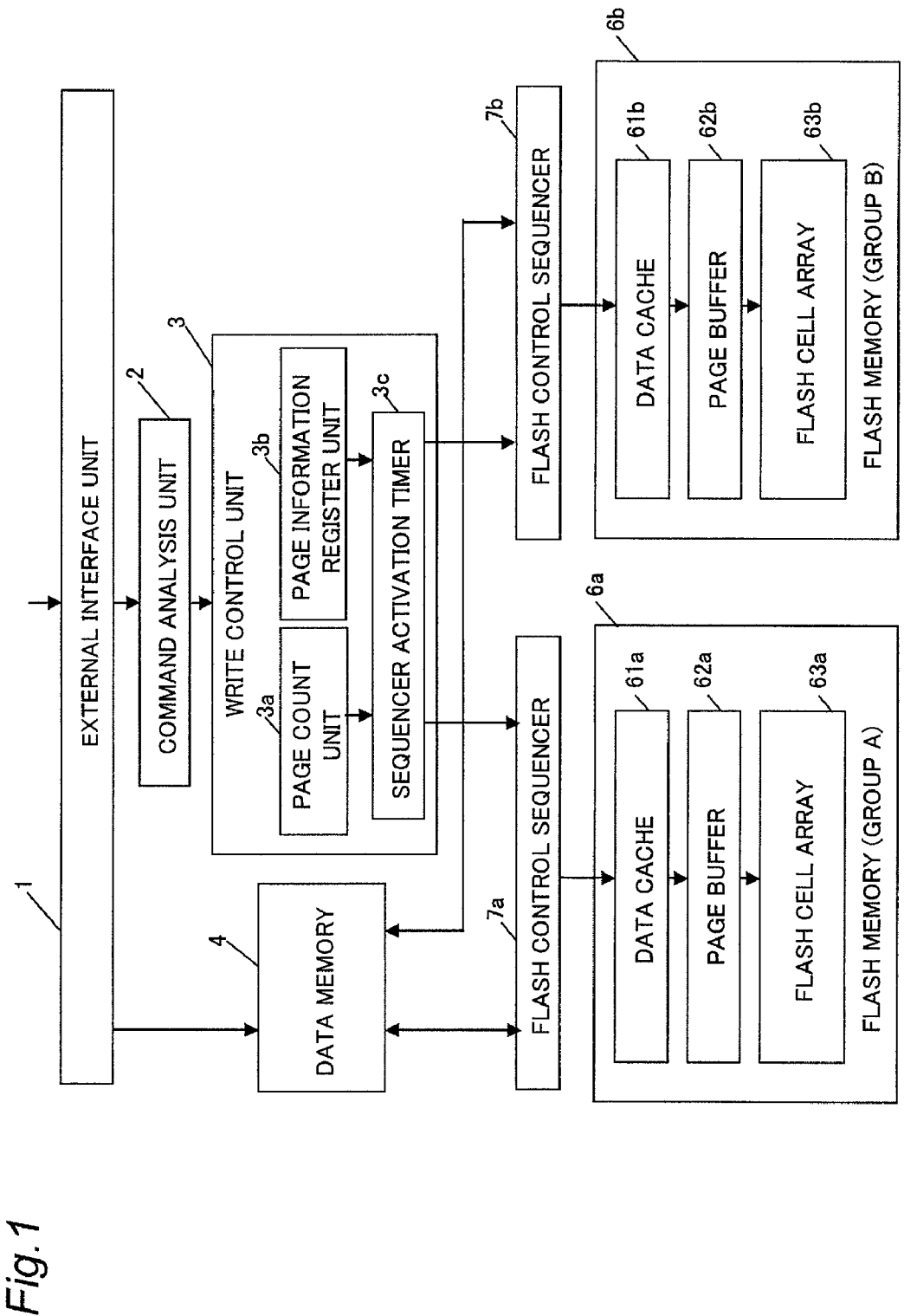
FIG. 1 shows a configuration diagram of a semiconductor storage device according to a first embodiment.
Figure 2:
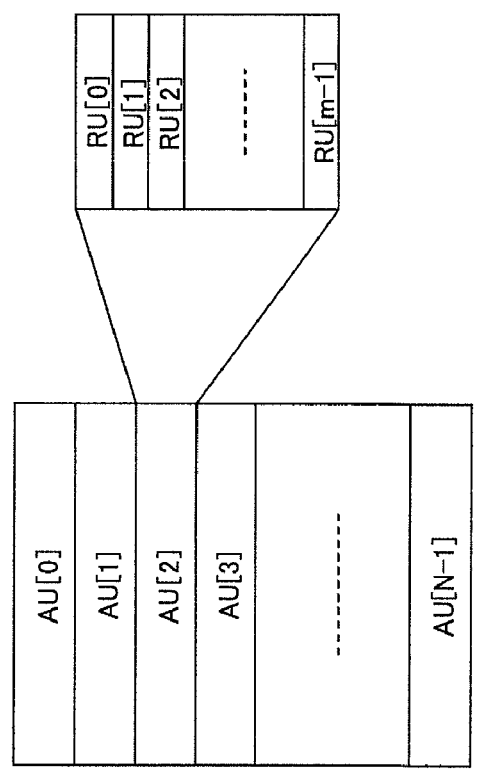
FIG. 2 shows the relationship between AUs and PUS of the semiconductor storage device.

FIG. 1 shows a configuration diagram of a semiconductor storage device according to the present embodiment. In the drawing, an external interface unit 1 is an interface that receives commands and data from a host device and that transfers the data. A command analysis unit 2 analyses the command received via the external interface unit 1. A write control unit 3 includes: a page count unit 3a that counts a record page position in an erasure block of flash memories 6a and 6b which will be described later; a page information register unit 3b that registers therein alignment information on each page comprising an erasure block of the flash memories 6a and 6b which will be described later; and a sequencer activation timer 3c that activates two flash control sequencers 7a (7b), which will be described later, in accordance with the page count unit 3a and the page information register unit 3b. A data memory 4 is a memory that temporarily stores the data received via the external interface unit 1, and has a storing capacity of at least for four pages (4×4 KB=16 KB). The flash control sequencers 7a and 7b read data from the data memory 4 in accordance with the sequencer activation timer 3c, and control writing data to the flash memories 6a and 6b. The flash memories 6a and 6b include data caches 61a and 61b, page buffers 62a and 62b, and flash cell arrays 63a and 63b, respectively.

Figure 3:
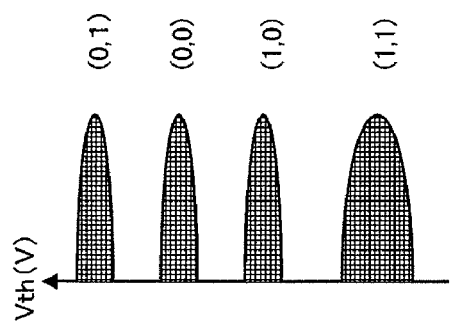
FIG. 3 shows electron accumulation states of a multilevel flash memory cell.

In the following, a detailed description will be given of the write operation of the semiconductor storage device structured as described above. First, the flash memories 6a and 6b will be described. In the present embodiment, a four-level flash memory is used for each of the flash memories 6a and 6b. The four-level flash memory has the electron distribution of the threshold voltage Vth such as shown in FIG. 3. As the detailed description thereof has already been given in relation to the conventional example, it is not repeated herein.

Figure 4:
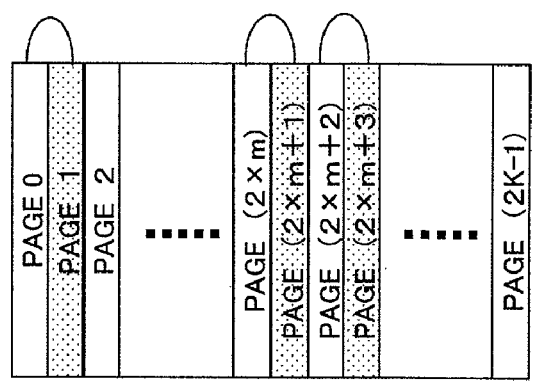
FIG. 4 shows cell sharing of a physical block of a multilevel flash memory.
Figure 5:
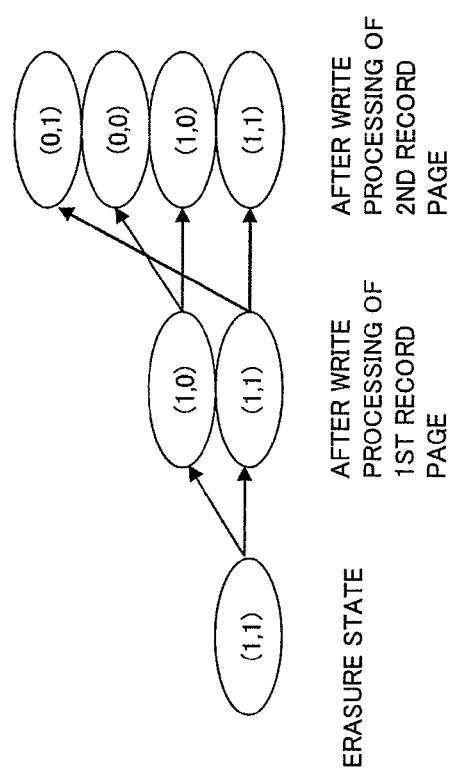
FIG. 5 shows a state transition diagram of a cell of a multilevel flash memory.

The erasure block has the structure shown in FIG. 4, and one record page has a capacity of 4 KB. The erasure block has 64 pages of the 1st record page (lower record page) and 64 pages of the 2nd record page (upper record page), and therefore is structured with 128 record pages in total. The data cache 61a (61b) and the page buffer 62a (62b) are each mounted by the capacity of the record page, i.e., 4 KB. In this manner, by mounting the data cache 61a (61b) at the previous stage of the page buffer 62a (62b) connected to the flash cell array 63a (63b), the data of the data cache 61a (61b) can be transferred while writing data is carried out to the flash cell array 63a (63b).

Accordingly, when the relationship of (the write tine to the flash cell array 63a (63b))>(the transfer time to the data cache 61a (61b)) is satisfied, the write time to the erasure block is equal to the transfer time for one page plus the write time to the flash cell array 63a (63b) for 128 pages. Thus, acceleration of the write tine to the flash memory 6a (6b) is achieved. The determination as to whether or not writing data to the flash memories 6a and 6b can be carried out is done by a Busy/Ready signal. With the flash memory 6a (6b) as in the present embodiment in which the data cache 61a (61b) is mounted, a state where data can be transferred to the data cache 61a (61b) is Ready. A Busy state is entered under the following conditions: one page is undergoing writing data from the page buffer 62a (62b) to the flash cell array 63a (63b); and one page is in the data cache 61a (61b) waiting for writing data to the flash cell array 63a (63b).

Figure 6:
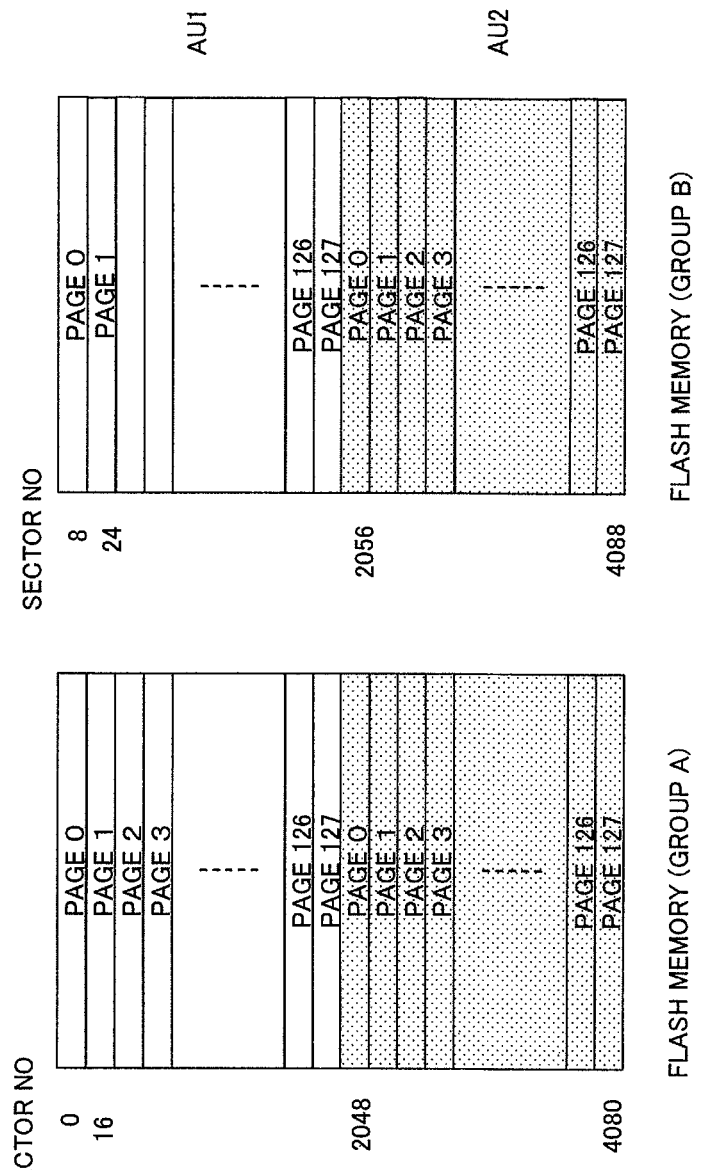
FIG. 6 shows a configuration diagram of AUs according to the first embodiment.

FIG. 6 shows a schematic diagram of the data alignment of the flash memories 6a and 6b according to the present embodiment. As shown in the drawing, pages 0 to 127 are each divided into two groups, and are interleaved and disposed in the two flash memories 6a and 6b, as group A and group B. As a result, when overwriting data is carried out to the already written flash memories 6a and 6b, the fastest speed is achieved by carrying out erasure processing of two erasure blocks (1 MB), thereafter carrying out simultaneous writing data to each of the erased two erasure blocks by 4 KB (i.e., carrying out writing data by 8 KB in total). Applying this to the speed guarantee specification of the SD card provides AU=1 MB, RU=8 KB. Thus, the maximum value in a case where 1 MB-AU undergoes writing data for 128 times on an RU-by-RU basis in order of pages is the speed guarantee value. Assuming that the maximum value of the time it takes to carry out erasure processing of each erasure block is Tew, the maximum value of the time it takes to carry out writing data to the 1st record page of each flash memory is T1w, and the maximum value of the time it takes to carry out writing data to the 2nd record page of each flash memory is T2w, the guarantee value of the time it takes to write 1 AU (=1 MB) is the sum of the following (1) to (5):

(1) time it takes to carry out writing data to the 1st record page made up of 64 pages in total=64×T1w;

(2) time it takes to carry out writing data to the 2nd record page made up of 64 pages in total=64×T2w;

(3) erasure time=Tew;

(4) time it takes to cache data of the first page; and (5) processing time of firmware and the like.

Each of the aforementioned maximum values of the time it takes to carry out writing data to the record pages is based on the premise that it is longer than the time it takes to carry out writing data to the data cache 61a (61b). Otherwise, the transfer time to the data cache 61a (61b) is not negligible.

In the following, a description will be given of a write operation of the semiconductor storage device according to the present embodiment.

(Write Operation Example 1)

Figure 7:
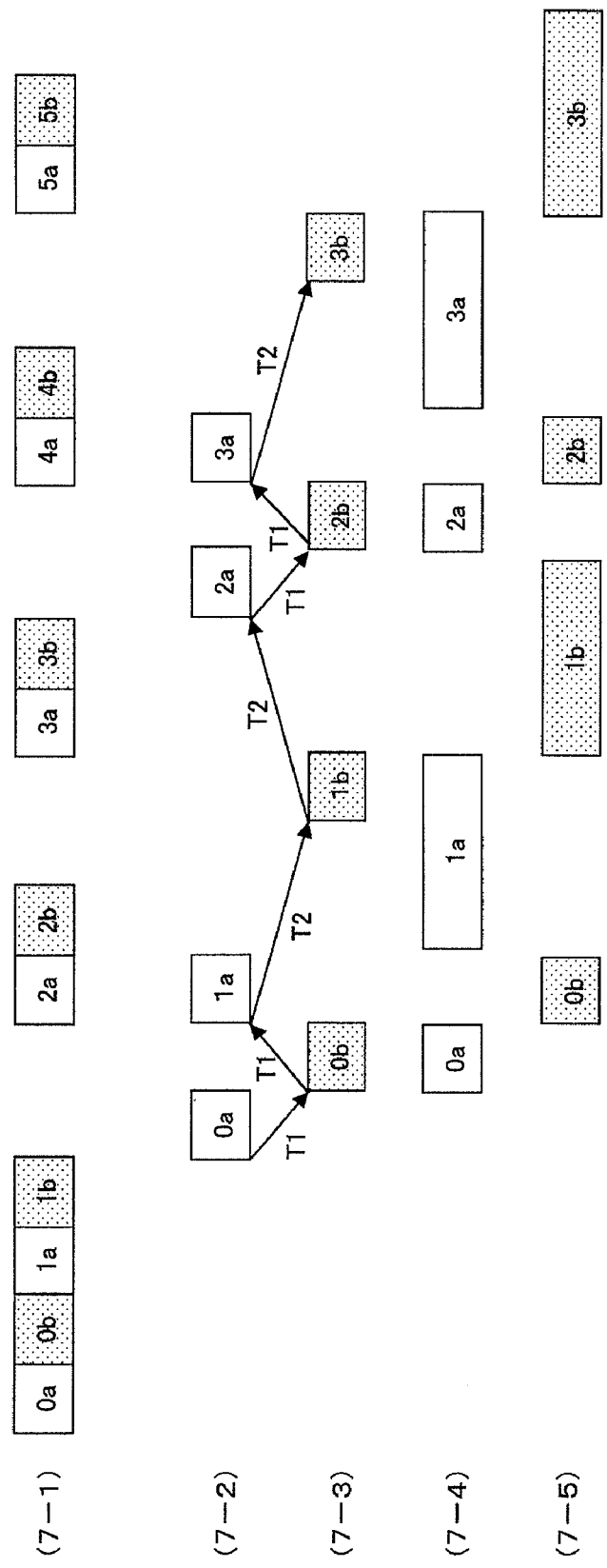
FIG. 7 shows a timing diagram (at a standard write speed) of substantial parts according to the first embodiment.

FIG. 7 shows a timing diagram of each part in a write operation mode according to the present embodiment, and shows a case where the write time of the flash memory 6a (6b) is a standard value. Here, the standard value of the write time is the expected write time with no conditions that hinder writing data. Further, it is an operation in a case where a command received via the external interface unit 1 is a write command that matches with the AU alignment. In the flash memory 6a (6b), even pages correspond to the 1st record page, and odd pages correspond to the 2nd record page. In the flash memory 6a (6b), the standard value of the write time of the 1st record page is T1, and the standard value of the write time of the 2nd record page is T2 (T2>T1). The reason why the write time of the 2nd record page is longer than the write time of the 1st record page has already been given in relation to the conventional example and, therefore, the description is not repeated herein.

In FIG. 7, (7-1) represents write timing to the data memory 4; (7-2) represents transfer timing to the data cache 61a of the flash memory 6a; (7-3) represents transfer timing to the data cache 61b of the flash memory 6b; (7-4) represents write timing to the flash cell array 63a of the flash memory 6a; and (7-5) represents write timing to the flash cell array 63b of the flash memory 6b. The data transfer amount is equal to the record page size, i.e., 4 KB.

Contents of a command received via the external interface unit 1 are analyzed by the command analysis unit 2. In a case where the command is a write command that matches with the AU alignment, as shown in (7-1), data is sequentially written from the host device to the data memory 4. Data 0a appearing in (7-1) corresponds to data to be written to page 0 in the flash memory 6a of group A, and data 0b appearing in (7-1) corresponds to data to be written to page 0 in the flash memory 6b of group B. Similarly, data 1a, 2a and 3a appearing in (7-1) correspond to data to be written to page 1, page 2 and page 3 in the flash memory 6a. Similarly, data 1b, 2b and 3b appearing in (7-1) correspond to data to be written to page 1, page 2 and page 3 in the flash memory 6b. Then, data 0a, 0b, 1a, and 1b for four pages in total are previously written to the data memory 4 (i.e., a memory full state), and thereafter, data for two pages is transferred to the flash memories 6a and 6b. After the transfer is completed, the next data for two pages is successively written.

The page count unit 3a in the write control unit 3 is reset at the first writing data to AU, and counts up the page numbers to be written by 8 KB on an AU-by-AU basis. The page information register unit 3b has registered therein the alignment information on the pages structuring each erasure block of the flash memory 6a (6b). In the present embodiment, even pages are registered as the 1st record page, and the odd pages are registered as the 2nd record page.

The sequencer activation timer 3c causes the flash control sequencer 7a (7b) connected to the flash memory 6a (6b) to operate, and at the same time, sets a timer value to a predetermined value to start count down. The timer value is set to T1 (first predetermined time) if the write-target record page is the 1st record page, and set to T2 (second predetermined time) if the write-target record page is the 2nd record page. Every time writing data to each record page is started, the sequencer activation timer 3c activates the timer 3c simultaneously with the start, whereby the two flash memories 6a (6b) undergo the alternate write operation with a time-base offset.

In writing data 0a to the first record page 0 of AU, the flash control sequencer 7a is activated, and at the same time, having the timer value set to T1 because the write page corresponds to the 1st record page, the sequencer activation timer 3c is operated to count down. Then, the flash control sequencer 7a reads data from the data memory 4, and transfers data of the first page to the data cache 61a of the flash memory 6a (data 0a of (7-2)).

When the timer value reaches 0, the flash control sequencer 7b is activated, and at the same time, having the timer value set to T1 because the write page corresponds to the 1st record page, the sequencer activation timer 3c is operated to count down. Then, the flash control sequencer 7b reads data from the data memory 4, and transfers data of the first page to the data cache 61b of the flash memory 6b (data 0b of (7-3)).

Next, when the timer value reaches 0 and if the flash memory 6a is ready (i.e., in a state where transfer to the data cache is possible), the flash control sequencer 7a is activated, and at the same time, having the timer value set to T2 because the write page corresponds to the 2nd record page, the sequencer activation timer 3c is operated to count down. Then, the flash control sequencer 7a reads data from the data memory 4, and transfers data of page 1 to the data cache 61a of the flash memory 6a (1a of (7-2)).

When the timer value readies 0 and if the flash memory 6b is ready (i.e., in a state where transfer to the data cache is possible), the flash control sequencer 7b is activated, and at the same time, having the timer value set to T2 because the write page corresponds to the 2nd record page, the sequencer activation timer 3c is operated to count down. Then, the flash control sequencer 7b reads data from the data memory 4, and transfers data of page 1 to the data cache 61b of the flash memory 6b (1b of (7-3)).

In this manner, every time the sequencer activation timer 3c activates the flash control sequencers 7a and 7b, the sequencer activation timer 3c sets the timer value to one of the first predetermined time T1 and the second predetermined time T2 based on whether the write-target record page is the 1st record page or the 2nd record page, to count down the timer value. Because the setting of the timer value is carried out simultaneously with the activation of the flash control sequencer 7a (7b), the setting of the timer value enters a wait state if the flash memory 6a (6b) connected to the flash control sequencer 7a (7b) is in a busy state (i.e., in a state where transfer to the data cache is impossible).

The rules for data transfer to the sequencer activation timer 3c and the flash memory 6a (6b) are summarized as follows.

(Rule 0) If the flash memory 6a (6b) is in a ready state and the sequencer activation timer 3c has a value of 0, then data is transferred to the data cache 61a (61b) of the flash memory 6a (6b).

(Rule 1) The set value of the sequencer activation timer 3c changes depending on the type (1st record page/2nd record page) of the record page subjected to data transfer.

(Rule 2) The sequencer activation timer 3c activates one flash memory 6a (6b) at a time, and does not activate two flash control sequencers at once.

Next, a description will be given of (7-4) and (7-5) in FIG. 7. (7-4) is a timing diagram of writing of data transferred fruit the data cache 61a of the flash memory 6a to the flash cell array 63a, wherein the reference characters 0a, 1a, 2a, and 3a denote writing of page 0, page 1, page 2, and page 3 of the flash memory 6a to the flash cell array 63a. Because page 0 and page 2 are the 1st record page, each write time progresses fast and the writing data is finished by T1 time. Because page 1 and page 3 are the 2nd record page, each write time progresses slowly and requires T2 time to finish writing data.

(7-5) is a timing diagram of writing of data transferred from the data cache 61b of the flash memory 6b to the flash cell array 63b, Wherein the reference characters 0b, 1b, 2b, and 3b denote writing of page 0, page 1, page 2, and page 3 of the flash memory 6b to the flash cell array 63b. Because page 0 and page 2 are the 1st record page, each write time progresses fast and the writing data is finished by T1 time. On the other hand, because page 1 and page 3 are the 2nd record page, each write time progresses slowly and requires T2 time to finish writing data.

As has been described, in the present embodiment, by performing control over the flash control sequencer 7a (7b) by driving the sequencer activation timer 3c so as to correspond to the standard value of the write time of the write target page, such that only one flash memory 6a (6b) is programming (writing data) when timer 3c is in operation, the power consumption can be suppressed.

The write time per AU when the present control is performed is the sum of following (1) to (5):

(1) time it takes to carry out writing data to the flash cell array 63a (63b) of the 1st record page made up of 64 pages in total=2×64×T1;

(2) time it takes to carry out writing data to the flash cell array 63a (63b) of the 2nd record page made up of 64 pages in total=2×64×T2;

(3) erasure time=Tew;

(4) time it takes until transfer of the first page to the data cache 61a is finished (the right end of data 0a in (7-2)); and (5) processing time of firmware and the like.

In the foregoing, because the sum of the time during which the sequencer activation timer 3c operates (the time it takes from the timer set until the value reaches 0) is equal to the time required by (1)+(2), the time during which the timer 3c operates is negligible.

(Write Operation Example 2)

Figure 8:
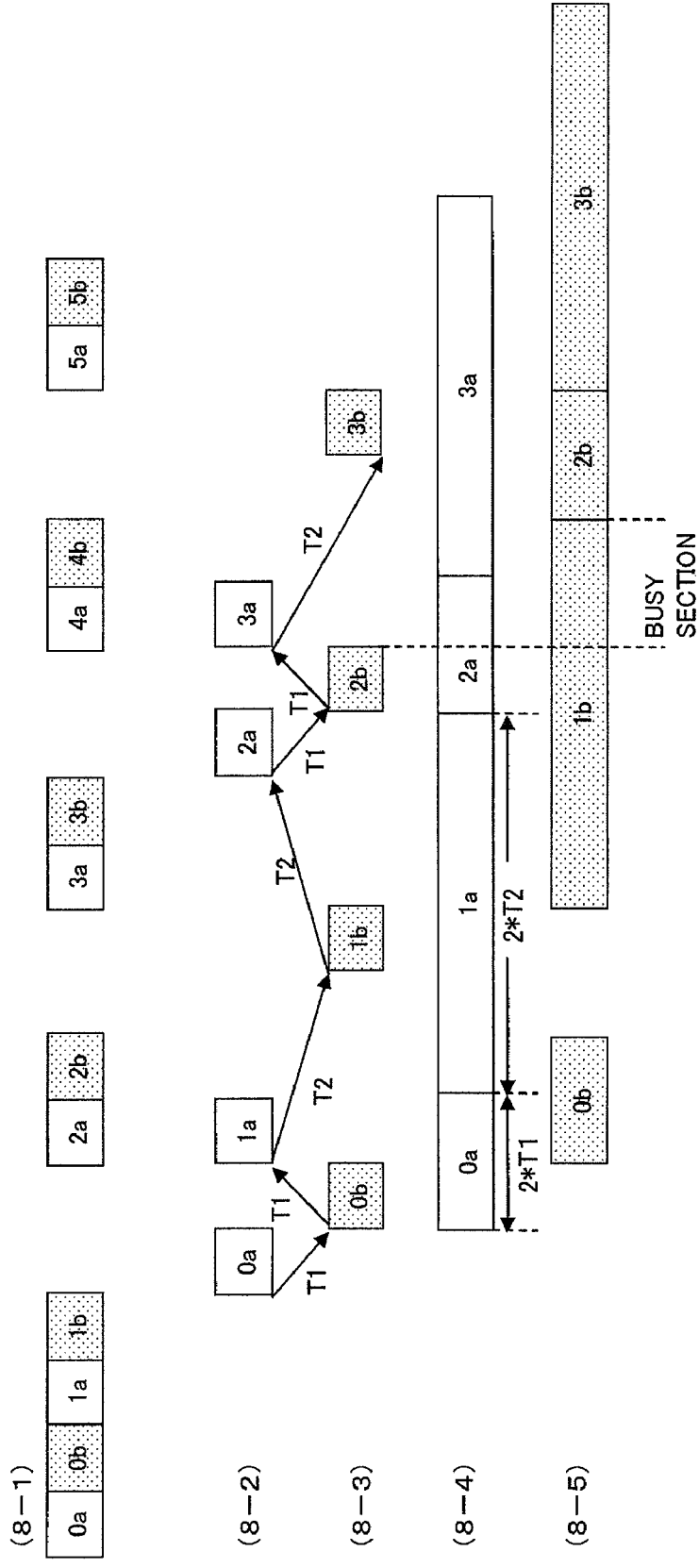
FIG. 8 shows a timing diagram (at half the standard write speed) of substantial parts according to the first embodiment.

FIG. 8 shows a timing diagram of each part in a write operation mode of the present embodiment, and shows a case where the write time of the flash memory 6a (6b) is twice as long as the standard value. In the drawing, (8-1) represents write timing to the data memory 4; (8-2) represents transfer timing to the data cache 61a of the flash memory 6a; (8-3) represents transfer timing to the data cache 61b of the flash memory 6b; (8-4) represents write timing of the data transferred from the data cache 61a of the flash memory 6a to the flash cell array 63a; and (8-5) represents write timing of the data transferred from the data cache 61b of the flash memory 6b to the flash cell array 63b. Similarly to FIG. 7, reference characters 0a to 5a and 0b to 5b denote data of the record pages of the flash memory 6a and flash memory 6b. Note that, in (8-1), (8-2) and (8-3), writing data is carried out at the identical timing to that in FIG. 7 and, therefore, the description is not repeated herein.

In (8-4) and (8-5), because the write time to each record page is doubled, writing data to each page continuously occurs without any time to wait. As a result, writing data to each of the two flash cell arrays 63a and 63b coincides with each other, which multiplies the current consumption value related to write data to the flash cell arrays 63a and 63b. The write time per AU when the write time to the flash cell array 63a (63b) is twice as long as the standard value is the sum of following (1) to (6):

(1) time it takes to carry out writing data to the flash cell array 63a (63b) of the 1st record page made up of 64 pages in total=2×64×T1;

(2) time it takes to carry out writing data to the flash cell array 63a (63b) of the 2nd record page made up of 64 pages in total=2×64×T2;

(3) erasure time=Tew;

(4) time it takes until transfer of the first page to the data cache 61a is finished (the right end of data 0a in (7-2));

(5) processing time of firmware and the like; and (6) write time of the last 2nd record page−T2=T2

Comparing FIG. 7 and FIG. 8 with each other, while the write time to record pages of the flash memory 6a (6b) in FIG. 8 is twice as long as that in FIG. 7, the difference in the write time to one AU is only the item corresponding to the aforementioned (6), i.e., (T2).

At the time when transfer of the data (2b) related to page 2 to the data cache 61b of the flash memory 6b is completed, writing data from page buffer 62b to the flash cell array 63b is underway, which makes the flash memory 6b be in a Busy state. On the other hand, transfer of data (3b) related to page 3 to the data cache 61b should be carried out after writing data 1b to the flash cell array 63b is completed, i.e., after the Busy state is solved. Accordingly, the write speed to the flash memories can be determined by times in control, irrespective of the busy state of the flash memories.

(Write Operation Example 3)

Figure 9:
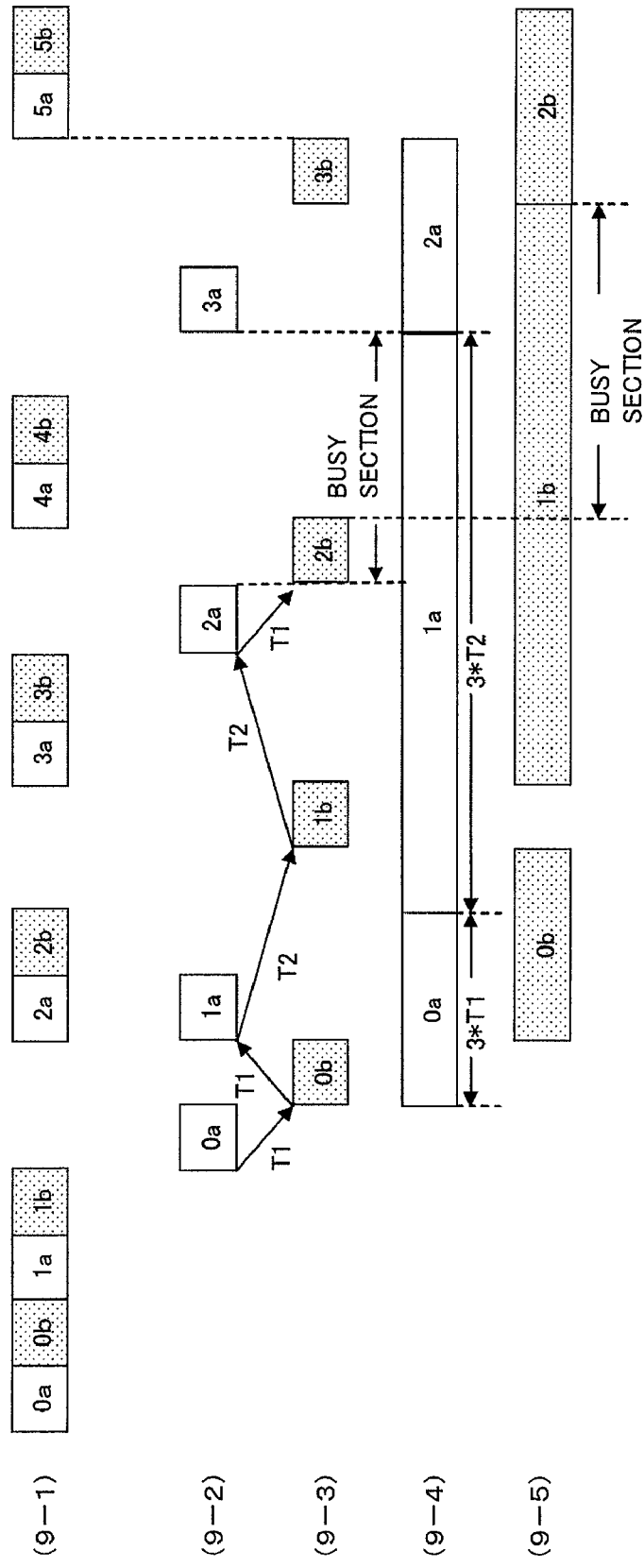
FIG. 9 shows a timing diagram (at a speed ⅓ as fast as the standard write speed) of substantial parts according to the first embodiment.

FIG. 9 shows a timing diagram of each part in a write operation node of the present embodiment, and shows a case where the write time of the flash memory 6a (6b) is three times as long as the standard value. In the drawing, (9-1) represents write timing to the data memory 4; (9-2) represents transfer timing to the data cache 61a of the flash memory 6a; (9-3) represents transfer timing to the data cache 61b of the flash memory 6b; (9-4) represents write timing of the data transferred from the data cache 61a of the flash memory 6a to the flash cell array 63a; and (9-5) represents write timing of the data transferred from the data cache 61b of the flash memory 6b to the flash cell array 63b. Similarly to FIG. 7, reference characters 0a to 5a, and 0b to 5b denote data of the record pages in the flash memory 6a and the flash memory 6b. Note that, being different from the cases shown in FIGS. 7 and 8, in (9-1), (9-2), (9-3), the write timing is timing determined by the write time of the flash memory 6a (6b). Specifically, even if an attempt is made by the flash control sequencer 7a (7b) to transfer data to the data cache 61a (61b) of the flash memory 6a(6b) in accordance with the timer setting value, as shown in FIG. 9, there exists timing where writing data (1a, 1b) of 1 page is underway at the flash memory 6a (6b) and data 2a and 2b of the next 1 page are waiting at the data cache 61a (61b), and hence, new data cannot be transferred to the data cache 61a (61b). That is to say, the control timing of the data memory 4 is restricted by the write time to the flash cell array 63a (63b).

In (9-4) and (9-5), because the write time to each record page is tripled, writing data to each page continuously occurs without any time to wait. As a result, writing data to each of two flash cell arrays 63a and 63b coincides with each other, which multiplies the current consumption value related to writing data to the flash cell arrays 63a and 63b. The write time per AU when the write time to the flash cell array 63a (63b) is three times as long as the standard value is the sum of following (1) to (6):

(1) time it takes to carry out writing data to the flash cell array 63a (63b) of the 1st record page made up of 64 pages in total=3×64×T1;

(2) time it takes to carry out writing data to the flash cell array 63a (63b) of the 2nd record page made up of 64 pages in total=3×64×T2;

(3) erasure time=Tew;

(4) time it takes until transfer of the first page to the data cache 61a is finished (the right end of data 0a in (7-2));

(5) processing time of firmware and the like; and (6) write time of the last 2nd record page−T2=2×T2

Comparing FIG. 7 and FIG. 9 with each other, in the writing data to record pages of the flash memory 6a (6b), the difference in the write time to one AU is as follows:

$$64 \times (T1+T2) + 2 \times T2 \qquad \text{(formula 1)}$$

Here, representing the sum of the times during which the timer counts down as Tref, Tref=2×64×(T1+T2). Also, the maximum value of the write time of the 1st record page is represented as T1w (T1w=3×T1), and the maximum value of the write time of the 2nd record page is represented as T2$w$ (T2$w$=3×T2). Then, (formula 1) is modified as the following (formula 2).

$$(64\times(T1w+T2w)-Tref)+(T2w-T2) \quad \text{(formula 2)}$$

Here, setting the timer value to be ½ as great as the maximum values T1$w$ and T2$w$, (formula 2) becomes:

Tref=2×64×(T1+T2)=2×64×(T1$w$/2+T2$w$/2). Note that the first term in (formula 2) becomes 0, which shows that writing data can be controlled at predetermined timing irrespective of variations in the write time of the flash memory 6$a$ (6$b$). Additionally, setting the timer value to be equal to or greater than the standard value Tav of the write time to the flash cell array 63$a$ (63$b$) as shown in FIG. 7, the current consumption by the writing data to the flash cell array 63$a$ (63$b$) is reduced by half.

Examining the matters described with reference to FIGS. 7 to 9, the following can be understood about the semiconductor storage device structured in accordance with the present embodiment.

[A] Setting the timer value of the sequencer activation timer 3$c$ to (the maximum value T1$w$ (T2$w$) of the write time to the flash cell array 63$a$ (63$b$))/2, writing data can be controlled at predetermined timing irrespective of variations in the write time of the flash memory 6$a$ (6$b$), and the write speed for the number of parallel writing to the flash memory 6$a$ (6$b$)) can be guaranteed.

[B] If the timer value is greater than the standard value of the write time to the flash cell array 63$a$ (63$b$), writing data to each of the flash cell arrays 63$a$ (63$b$) of the two flash memories 6$a$ (6$b$) rarely coincides with each other and, therefore, the current consumption can be suppressed.

Based on [A] and [B], representing the standard value of the write time of the record page to the flash cell array 63$a$ (63$b$) as Tave and the maximum value as Tw, and setting the timer value of the sequencer activation timer 3$c$ to satisfy the following formula:

$$\text{Tave}<\text{timer value}\leq Tw/2 \quad \text{(formula 3)}$$

then, when the write time to the flash cell array 63$a$ (63$b$) is equal to or smaller than the timer value, the current consumption can be suppressed, and the write speed equivalent to that in parallel writing data can be guaranteed.

(Summary)

As has been Described, According to the Present embodiment, when it is determined by the page determine unit that a page to be written data is the 1st record page, after a lapse of T1 time from start of writing data of one of the groups, writing data of another group is started; when it is determined by the page determine unit that a page to be written data is the 2nd record page, after a lapse of T2 time, writing data of another group is started. Therefore, by setting offset value T1 for the start time of writing data to be equal to or greater than the standard time required to write data of the 1st record page, and setting offset value T2 for the start time of writing data to be equal to or greater than the standard time required to writing data of the 2nd record page, in a case where the write time in the flash memories is approximately as great as the standard value, the flash memories respectively belonging to two groups do not undergo simultaneous writing data. This suppresses the power consumption. That is, the fastest possible recording can be achieved by using a plurality of multilevel flash memories, while aiming to reduce the power consumption.

Further, by setting the offset value T1 for the start time of writing data to be equal to or smaller than half the maximum value of the write time of the 1st record page, and setting the offset value T2 for the start time of writing data to be equal to or smaller than half the maximum value of the write time of the 2nd record page, when the write time of the flash memories varies to the maximum value, the offset values T1 and T2 for the start time of writing data are cancelled by the write time of the flash memories, and hence the guarantee value of the write speed of the semiconductor storage device will not be impaired by the offset values for the start time of writing data.

Still further, when the offset value T1 for the start time of writing data is equal to or greater than a value obtained by the standard value required to write data of the 1st record page added by a predetermined margin, and the offset value T2 for the start time of writing data is equal to or greater than a value obtained by the standard value required to write data of the 2nd record page added by a predetermined margin, the flash memories respectively belonging to two groups rarely undergo simultaneous writing data. This makes it possible to provide a semiconductor storage device with suppressed power consumption, without impairing the guarantee value of the write speed of the semiconductor storage device.

(Second Embodiment)

In the first embodiment, the description has been given of the scheme to interleave data in two groups for each record page. In the present embodiment, a description will be given of a scheme to interleave data in two groups every two record pages, to achieve recording.

Figure 10:
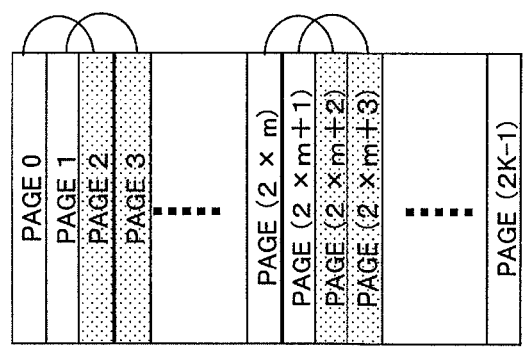
FIG. 10 shows cell sharing of a physical block of a multi-level flash memory.

FIG. 10 shows the cell sharing relationship of a block in each flash memory of the present embodiment. The difference from FIG. 4 lies in that, while the 1st record page (Lower record page) and the 2nd record page (Upper record page) are alternately laid out for each page in FIG. 4, the 1st record page and the 2nd record page are laid out every two pages in FIG. 10. Thus, the pages that share a cell are not the pages of which numbers are adjacent to each other's. Instead, the 1st record page having page number X shares a cell with the 2nd record page having page number X+2.

The semiconductor storage device according to the present embodiment is structured similarly to that of the first embodiment shown in FIG. 1 and, therefore, the description thereof is not repeated herein.

A description will be given of a write operation in flash memories having the above-described cell structure, referring to FIG. 11.

Figure 11:
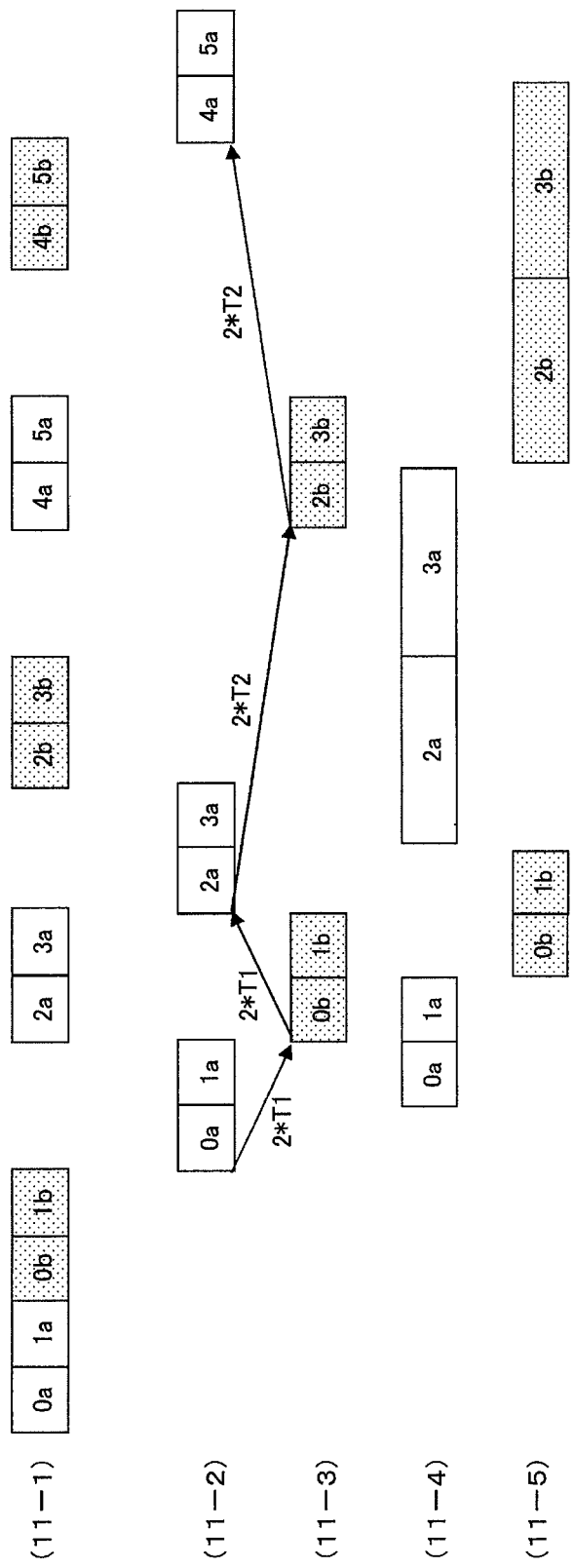
FIG. 11 shows a timing diagram (at a standard write speed) of substantial parts according to a second embodiment.

FIG. 11 shows a timing diagram of each part in a write operation mode in the present embodiment, and shows a case where the write time of the flash memory 6$a$ (6$b$) is a standard value. Here, the standard value of the write time is the expected write time with no conditions that hinder writing data. Further, it is an operation in a case where a command received via the external interface unit 1 is a write command that matches with the AU alignment. In the flash memory 6$a$ (6$b$), 4*N and 4*N+1 pages (where N is an integer equal to or greater than 0) correspond to the 1st record page, and 4*N+2 and 4*N+3 pages correspond to the 2nd record page. In the flash memory 6$a$ (6$b$), the standard value of the write time of the 1st record page is T1, and the standard value of the write time of the 2nd record page is T2 (T2>T1). The reason why the write time of the 2nd record page is longer than the write time of the 1st record page has already been given in relation to the conventional example.

In FIG. 11, (11-1) represents write timing to the data memory 4; (11-2) represents transfer timing to the data cache 61$a$ of the flash memory 6$a$; (11-3) represents transfer timing to the data cache 61$b$ of the flash memory 6$b$; (11-4) represents write timing to the flash cell array 63$a$ of the flash memory 6$a$; and (11-5) represents write timing to the flash cell array 63*b* of the flash memory 6*b*. The data transfer amount is equal to the record page size, i.e., 4 KB.

A command received via the external interface unit 1 has its contents analyzed by the command analysis unit 2. In a case where the command is a write command that matches with the AU alignment, as shown in (11-1), data is sequentially written from the host device to the data memory 4. Data 0*a* appearing in (11-1) corresponds to data to be written to page 0 in the flash memory 6*a* of group A, and data 0*b* appearing in (11-1) corresponds to data to be written to page 0 in the flash memory 6*b* of group B. Similarly, data 1*a*, 2*a* and 3*a* appearing in (11-1) correspond to data to be written to page 1, page 2 and page 3 in the flash memory 6*a*. Similarly, data 1*b*, 2*b* and 3*b* appearing in (11-1) correspond to data to be written to page 1, page 2 and page 3 in the flash memory 6*b*. Then, data 0*a*, 1*a*, 0*b*, and 1*b* for four pages in total are previously written to the data memory 4 (i.e., a memory full state), and thereafter, data 0*a* and 1*a* for two pages are transferred to the flash memory 6*a*. After the transfer is completed, the next data 0*b* and 1*b* for two pages are transferred to flash memory 6*b* to be successively written. The difference from the first embodiment lies in that, while transfer is carried out alternately to two flash memories for each page in the first embodiment, transfer is carried out alternately to two flash memories every two pages in the present embodiment. The flash memory 6*a* (6*b*) has a two-face structure made up of the data cache 61*a* (61*b*) and the page buffer 62*a* (62*b*), to write data transferred from an external source to the data cache 61*a* (61*b*), and to write data from the page buffer 62*a* (62*b*) to the flash cell array 63*a* (63*b*). Transfer from the data cache 61*a* (61*b*) to the page buffer 62*a* (62*b*) is carried out at fast speed at a time when the data of the page buffer 62*a* (62*b*) is written to the flash cell array 63*a* (63*b*). Hence, performing control such that data for two pages are continuously transferred to the flash memory 6*a*(6*b*), as in the present embodiment, poses no particular problem.

The sequencer activation timer 3*c* causes the flash control sequencer 7*a* (7*b*) connected to the flash memory 6*a* (6*b*) to operate, and at the same time, sets a timer value to a predetermined value to start count down. The timer value is set to 2*T1 (first predetermined time) if the write-target record pages are 4*N page and 4*N+1 page, and set to 2*T2 (second predetermined time) if the write-target record pages are 4*N+2 page and 4*N+3 page. Every time writing data to each of 4*N page and 4*N+2 page is started, the sequencer activation timer 3*c* activates the timer 3*c* simultaneously with the start, whereby the two flash memories 6*a* (6*b*) undergo the alternate write operation with a time-base offset.

In writing data 0*a* to the first record page 0 of AU, the flash control sequencer 7*a* is activated, and at the same time, having the timer value set to 2*T1 because the write pages correspond to the 1st record page and two pages are continuously recorded, the sequencer activation timer 3*c* is operated to count down. Then, the flash control sequencer 7*a* reads data from the data memory 4, and transfers data of the first page to the data cache 61*a* of the flash memory 6*a* (data 0*a* and 1*a* of (11-2)).

When the timer value reaches 0, the flash control sequencer 7*b* is activated, and at the same time, having the timer value set to 2*T1 because the write pages correspond to the 1st record page and two pages are continuously recorded, the sequencer activation timer 3*c* is operated to count down. Then, the flash control sequencer 7*b* reads data from the data memory 4, and transfers data of the first page to the data cache 61*b* of the flash memory 6*b* (data 0*b* and 1*b* of (11-3)).

Next, When the timer value reaches 0 and if the flash memory 6*a* is ready (i.e., in a state where transfer to the data cache is possible), the flash control sequencer 7*a* is activated, and at the same time, having the timer value set to 2*T2 because the write pages correspond to the 2nd record page and two pages are continuously recorded, the sequencer activation timer 3*c* is operated to count down. Then, the flash control sequencer 7*a* reads data from the data memory 4, and transfers data of page 1 to the data cache 61*a* of the flash memory 6*a* (data 2*a* and 3*a* of (11-2)).

When the timer value reaches 0 and if the flash memory 6*b* is ready (i.e., in a state where transfer to the data cache is possible), the flash control sequencer 7*b* is activated, and at the same time, having the timer value set to 2*T2 because the write pages correspond to the 2nd record page and two pages are continuously recorded, the sequencer activation timer 3*c* is operated to count down. Then, the flash control sequencer 7*b* reads data from the data memory 4, and transfers data of page 1 to the data cache 61*b* of the flash memory 6*b* (data 2*b* and 3*b* of (11-3)).

In this manner, every time the sequencer activation timer 3*c* activates the flash control sequencers 7*a* and 7*b*, the sequencer activation timer 3*c* sets the timer value to one of the first predetermined time 2*T1 and the second predetermined time 2*T2 based on whether the write-target record pages are the 1st record page or the 2nd record page, to count down the timer value. Because the setting of the timer value is carried out simultaneously with the activation of the flash control sequencer 7*a* (7*b*), the setting of the timer value enters a wait state if the flash memory 6*a* (6*b*) connected to the flash control sequencer 7*a* (7*b*) is in a busy state (i.e., in a state where transfer to the data cache is impossible).

Next, a description will be given of (11-4) and (11-5) in FIG. 11. (11-4) is a timing diagram of writing of data transferred from the data cache 61*a* of the flash memory 6*a* to the flash cell array 63*a*. The reference characters 0*a*, 1*a*, 2*a*, and 3*a* denote writing data of page 0, page 1, page 2, and page 3 of the flash memory to the flash cell array 63*a*. Because page 0 and page 1 are the 1st record page, each write time progresses fast and writing data of two continuous pages is finished by 2*T1 time. Because page 2 and page 3 are the 2nd record page, each write time progresses slowly and requires 2*T2 time to finish writing data for two pages.

(11-5) is a timing diagram of writing of data transferred from the data cache 61*b* of the flash memory 6*b* to the flash cell array 63*b*. The reference characters 0*b*, 1*b*, 2*b*, and 3*b* denote writing data of page 0, page 1, page 2, and page 3 of the flash memory 6*b* to the flash cell array 63*b*. Because page 0 and page 1 are the 1st record page, each write time progresses fast and writing data of two continuous pages is finished by 2*T1 time. Because page 2 and page 3 are the 2nd record page, the write time progresses slowly and requires 2*T2 time to finish writing data for two pages.

As has been described, in the present embodiment, data transfer is carried out by interleaving data in the two flash memory groups every two continuous record pages basis, and control is performed over the two flash control sequencers 7*a* (7*b*) by driving the sequencer activation timer 3*c* in accordance with the sum of respective standard values of write time of the two continuous record pages, such that only one flash memory 6*a* (6*b*) is programming (writing data) When timer 3*c* is in operation. Thus, the power consumption can be suppressed.

In this manner, by interleaving data based on the page layout of the flash memories, and setting the sequencer activation timer to the sum of respective standard values of write time of the pages treated as a group when interleaved, the idea of the present invention can be applied without being limited by the page layout of the flash memories.

(Third Embodiment)

In the first embodiment, interleaving data is carried out in two flash memory groups for each page, and the timer is set to T1 at the start of writing data to the 1st record page and the timer is set to T2 at the start of writing data to the 2nd record page, to control the sequencers.

In the second embodiment, with the flash memories in which the 1st record page and the 2nd record page each continue by two pages, interleaving data is carried out in two flash memory groups every two pages, and the timer is set to 2*T1 at the start of writing data of the 1st record page and the timer is set to 2*T2 at the start of writing data of the 2nd record page, to control the sequencers.

On the other hand, in the present embodiment, with the flash memories each structured as shown in FIG. 4, interleaving data is carried out in two flash memory groups, every two pages, wherein the two pages are made up of one 1st record page and one 2nd record page, and the timer is set to T1+T2 at the start of writing data of the two record pages interleaved, to control the sequencers.

The semiconductor storage device according to the present embodiment is structured similarly to that of the first embodiment shown in FIG. 1 and, therefore, the description is not repeated herein.

A description will be given of a write operation according to the present embodiment, referring to FIG. 12.

Figure 12:
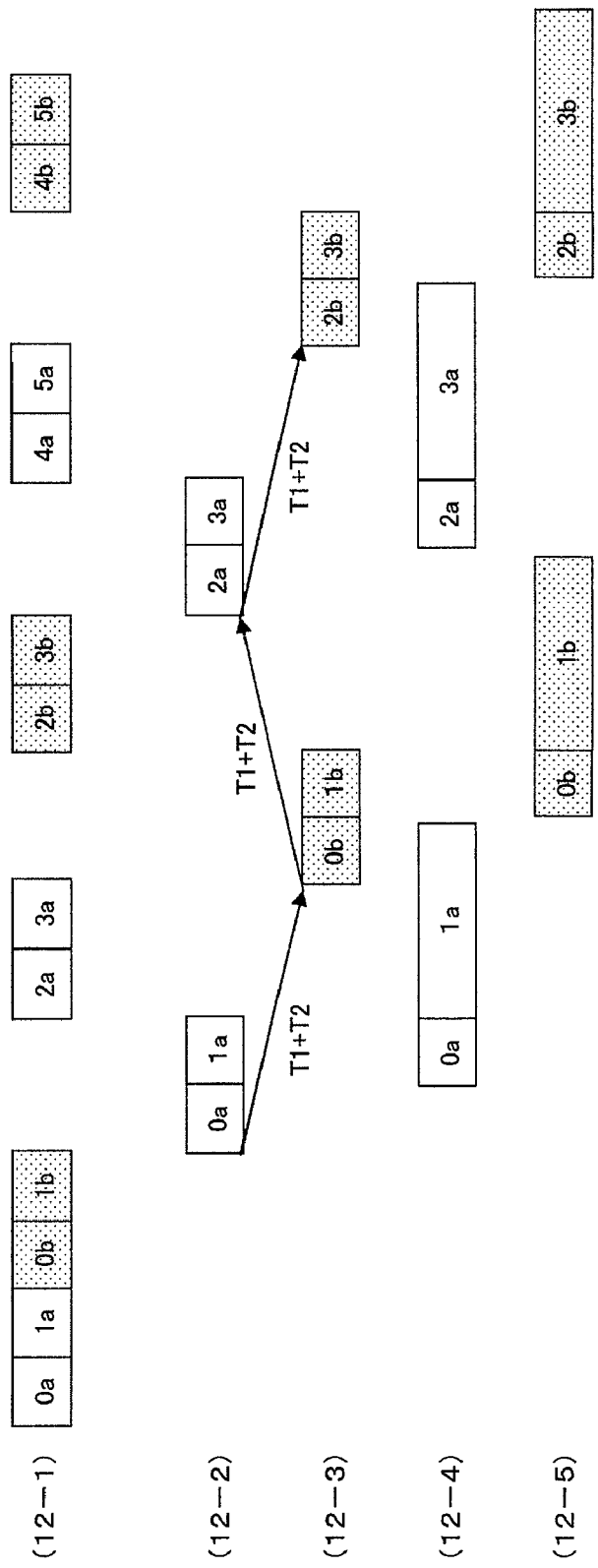
FIG. 12 shows a timing diagram (at a standard write speed) of substantial parts according to a third embodiment.

FIG. 12 shows a timing diagram of each part in a write operation mode in the present embodiment, and shows a case Where the write time of the flash memory 6a (6b) is a standard value. Here, the standard value of the write time is the expected write time with no conditions that hinder writing data. Further, it is an operation in a case where a command received via the external interface unit 1 is a write command that matches with the AU alignment. In the flash memory 6a (6b), even pages correspond to the 1st record page, and odd pages correspond to the 2nd record page. In the flash memory 6a (6b), the standard value of the write time of the 1st record page is T1, and the standard value of the write time of the 2nd record page is T2 (T2>T1). The reason Why the write time of the 2nd record page is longer than the write time of the 1st record page has already been given in relation to the conventional example.

In FIG. 12, (12-1) represents write timing to the data memory 4; (12-2) represents transfer timing to the data cache 61a of the flash memory 6a; (12-3) represents transfer timing to the data cache 61b of the flash memory 6b; (12-4) represents write timing to the flash cell array 63a of the flash memory 6a; and (12-5) represents write timing to the flash cell array 63b of the flash memory 6b. The data transfer amount is equal to the record page size, i.e., 4 KB.

A command received via the external interface unit 1 has its contents analyzed by the command analysis unit 2. In a case where the command is a write command that matches with the AU alignment, as shown in (12-1), data is sequentially written from the host device to the data memory 4. Data 0a appearing in (12-1) corresponds to data to be written to page 0 in the flash memory 6a of group A, and data 0b appearing in (12-1) corresponds to data to be written to page 0 in the flash memory 6b of group B. Similarly, data 1a, 2a and 3a appearing in (11-1) correspond to data to be written to page 1, page 2 and page 3 in the flash memory 6a. Similarly, data 1b, 2b and 3b appearing in (12-1) correspond to data to be written to page 1, page 2 and page 3 in the flash memory 6b. Then, data 0a, 1a, 0b, and 1b for four pages in total are previously written to the data memory 4 (i.e., a memory full state), and thereafter, data 0a and 1a for two pages are transferred to the flash memory 6a. After the transfer is completed, the next data 0b and 1b for two pages are transferred to the flash memory 6b to be successively written.

The sequencer activation timer 3c causes the flash control sequencer 7a (7b) connected to the flash memory 6a (6b) to operate, and at the same time, sets a timer value to a predetermined value to start count down. Being different from the first and second embodiments, the timer value is always set to T1+T2. This is because the 1st record page and the 2nd record being different in write speed from each other are handled together, and hence a constant write speed is expected at the time when the timer value is set.

In writing data 0a to the first record page 0 of AU, the flash control sequencer 7a is activated, and at the same time, having the timer value set to T1+T2 because the write pages correspond to both the 1st record page and the 2nd record page and the 1st record page and the 2nd record page are continuously recorded, the sequencer activation timer 3c is operated to count down. Then, the flash control sequencer 7a reads data from the data memory 4, and transfers data of the first page to the data cache 61a of the flash memory 6a ((data 0a and 1a of 12-2)).

When the timer value reaches 0, the flash control sequencer 7b is activated, and at the same time, having the timer value set to T1+T2 because the write pages correspond to both the 1st record page and the 2nd record page and the 1st record page and the 2nd record page are continuously recorded, the sequencer activation timer 3c is operated to count down. Then, the flash control sequencer 7b reads data from the data memory 4, and transfers data of the first page to the data cache 61b of the flash memory 6b (data 0b and 1b of (12-3)).

Next, when the timer value reaches 0 and if the flash memory 6a is ready (i.e., in a state Where transfer to the data cache is possible), the flash control sequencer 7a is activated, and at the same time, having the timer value set to T1+T2 because the write pages correspond to both the 1st record page and the 2nd record page and the 1st record page and the 2nd record page are continuously recorded, the sequencer activation timer 3c is operated to count down. Then, the flash control sequencer 7a reads data from the data memory 4, and transfers data of page 1 to the data cache 61a of the flash memory 6a (data 2a and 3a of (12-2)).

When the timer value reaches 0 and if the flash memory 6b is ready (i.e., in a state where transfer to the data cache is possible), the flash control sequencer 7b is activated, and at the same time, having the timer value set to T1+T2 because the write pages correspond to both the 1st record page and the 2nd record page and the 1st record page and the 2nd record page are continuously recorded; the sequencer activation timer 3c is operated to count down. Then, the flash control sequencer 7b reads data from the data memory 4, and transfers data of page 1 to the data cache 61b of the flash memory 6b (data 2b and 3b of (12-3)).

In this manner, every time the sequencer activation timer 3c activates the flash control sequencers 7a and 7b, the sequencer activation timer 3c sets the timer value to the sum of the first predetermined time and the second predetermined time (T1+T2), to count down the timer value. Because the setting of the timer value is carried out simultaneously with the activation of the flash control sequencer 7a (7b), the setting of the timer value enters a wait state if the flash memory 6a (6b) connected to the flash control sequencer 7a (7b) is in a busy state (i.e., in a state where transfer to the data cache is impossible).

Next, a description will be given of (12-4) and (12-5) in FIG. 12. (12-4) is a timing diagram of writing of data transferred from the data cache 61a of the flash memory 6a to the flash cell array 63*a*, wherein the reference characters 0*a*, 1*a*, 2*a*, and 3*a* denote writing of page 0, page 1, page 2, and page 3 of the flash memory to the flash cell array 63*a*. As Shown in the drawing, because the 1st page of which write time progresses fast and the 2nd page of which write time progresses slow are handled together, the writing of two continuous pages is finished by T1+T2 time.

(12-5) is a timing diagram of writing of data transferred from the data cache 61*b* of the flash memory 6*b* to the flash cell array 63*b*, Wherein the reference characters 0*b*, 1*b*, 2*b*, and 3*b* denote writing data of page 0, page 1, page 2, and page 3 of the flash memory 6*b* to the flash cell array 63*b*. As shown in the drawing, because the 1st page of which write time progresses fast and the 2nd page of which write time progresses slow are handled together, writing data of two continuous pages is finished by T1+T2 time.

As has been described, in the present embodiment, data transfer is carried out by interleaving data in the two flash memory groups every two continuous record pages basis, and control is performed over the two flash control sequencers 7*a* (7*b*) by driving the sequencer activation timer 3*c* in accordance with the sum of respective standard values of write time of the two continuous record pages, such that only one flash memory 6*a* (6*b*) is programming (writing data) when timer 3*c* is in operation. Thus, the power consumption can be suppressed.

Further, because interleaving data is carried out in the flash memory groups every two record pages wherein the 1st record page of which write time progresses fast and the 2nd record page of which write time progresses slow are handled together, it is not necessary to set the timer value depending on the write page number.

(Fourth Embodiment)

In the first to third embodiments, the exemplary cases have been shown in which the present invention is applied to 2-bit per cell flash memories. In contrast, in the present embodiment, a description will be given of an exemplary case in which the present invention is applied to 3-bit per cell flash memories. First, a description will be given of the structure of a 3-bit per cell multilevel flash memory, and thereafter, a description will be given of a method for writing data to the flash memory.

Figure 13:
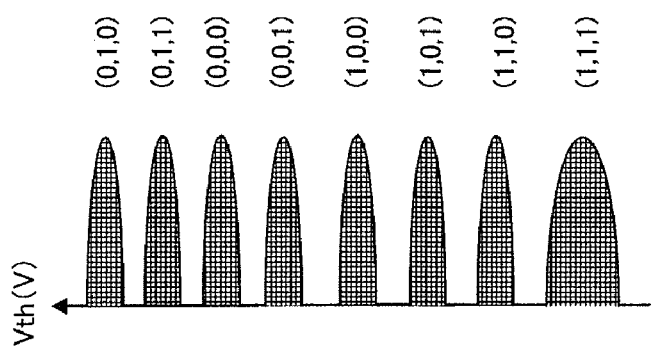
FIG. 13 shows electron accumulation states of a 3-bit per cell flash memory.

FIG. 13 shows an example of the relationship between the number of electrons accumulated in the floating gate of a 3-bit per cell multilevel flash memory and the threshold voltage (Vth). As shown in the drawing, in an eight-level flash memory to which 3-bit per cell technique is applied, the accumulation state of the electrons in the floating gate is managed by eight states based on the threshold voltage (Vth). The threshold voltage is the lowest in an erasure state, which is associated with (1, 1, 1). As the electrons accumulate, the threshold voltage discretely increases, the states thereof being associated with (1, 1, 0), (1, 0, 1), (1, 0, 0), (0, 0, 1), (0, 0, 0), (0, 1, 1), and (0, 1, 0), respectively. In this manner, because the threshold voltage increases in proportion to the number of electrons accumulated, by performing control so as to be within a predetermined threshold voltage, it becomes possible to record 3-bit data in one memory cell.

Figure 14:
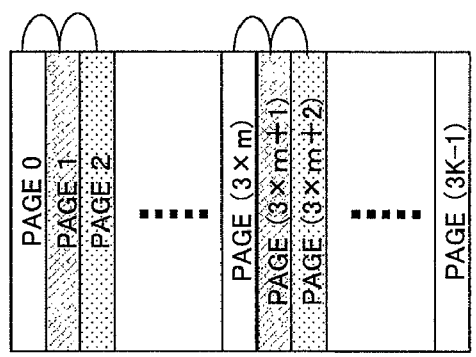
FIG. 14 shows cell sharing of a physical block of a 3-bit per cell flash memory.

FIG. 14 shows a schematic diagram of one erasure block of a 3-bit/cell flash memory. The erasure block shown in the drawing is structured with 3×K pages (Where K is a natural number). The write processing is carried out in ascending order from page number 0. Here, it is assumed that a page being 3 m (where m is an integer that satisfies the relationship $0 \leq m \leq K-1$)), a page being 3×m+1, and a page being 3×m+2 are in a relationship where they share one memory cell (hereinafter referred to as the cell sharing relationship). Among the pages in the cell sharing relationship, the page to be written first is defined as the 1st record page, the page to be written next is defined as the 2nd record page, and the page to be written next is defined as the 3rd record page. That is to say, writing data to the page number (3×m) (writing data to the 1st record page), writing data to page number (3×m+1) (writing data to the 2nd record page), and writing data to page number (3×m+2) (writing data to the 3rd record page) correspond to charging of electrons to an identical cell.

Then, the bits are associated with the 1st record page, the 2nd record page, and the 3rd record page, respectively. In writing data of the 1st record page, the state transits from 1-state to 2-state; in writing data of the 2nd record page, the state transits fruit 2-state to 4-state; and in writing data of the 3rd record page, the state transits fruit 4-state to 8-state. Hence, electron injection occurs once in writing data of the 1st page; electron injection occurs twice in writing data of the 2nd page; and electron injection occurs four times in writing data of the 3rd page. Therefore, the writing speed becomes slow in order.

In the fourth embodiment, in the flash memories structured as above, interleaving data is carried out in two flash memory groups for each page, and the timer is set to T1 at the start of writing data to the 1st record page; the timer is set to T2 at the start of writing data to the 2nd record page; and the timer is set to T3 at the start of writing data to the 3rd record page, to control the sequencers.

The semiconductor storage device according to the present embodiment is structured similarly to that of the first embodiment shown in FIG. 1 and, therefore, the description thereof is not repeated herein.

A description will be given of a write operation according to the present embodiment, referring to FIG. 15.

Figure 15:
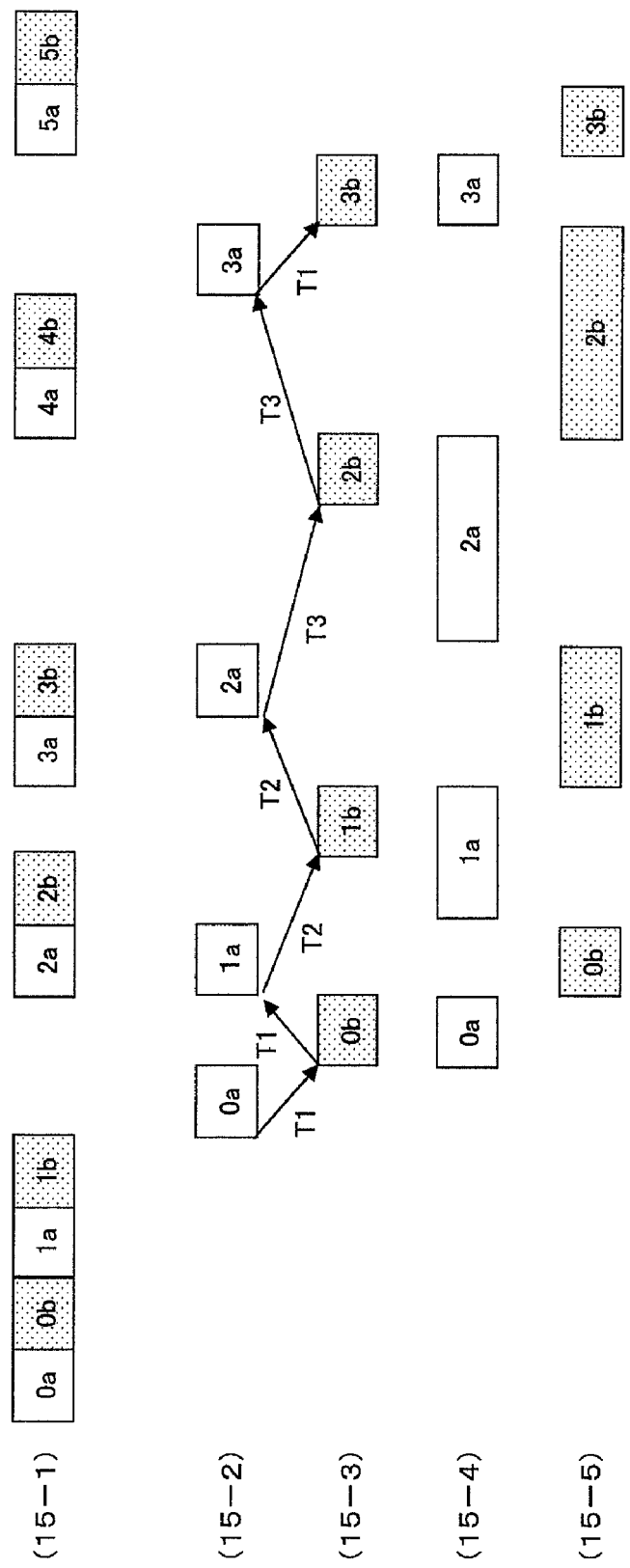
FIG. 15 shows a timing diagram (at a standard write speed) of substantial parts according to a fourth embodiment.

FIG. 15 shows a timing diagram of each part in a write operation mode in the present embodiment, and shows a case Where the write time of the flash memory 6*a* (6*b*) is a standard value. Here, the standard value of the write time is the expected write time with no conditions that hinder writing data. In the flash memory 6*a* (6*b*), the standard value of the write time of the 1st record page is T1; the standard value of the write time of the 2nd record page is 12; and the standard value of the write time of the 3rd record page is T3 (T3>T2>T1).

In FIG. 15, (15-1) represents write timing to the data memory 4; (15-2) represents transfer timing to the data cache 61*a* of the flash memory 6*a*; (15-3) represents transfer timing to the data cache 61*b* of the flash memory 6*b*; (15-4) represents write timing to the flash cell array 63*a* of the flash memory 6*a*; and (15-5) represents write timing to the flash cell array 63*b* of the flash memory 6*b*. The data transfer amount is equal to the record page size, i.e., 4 KB.

A command received via the external interface unit 1 has its contents analyzed by the command analysis unit 2. In a case where the command is a write command that matches with the AU alignment, as shown in (15-1), data is sequentially written from the host device to the data memory 4. Data 0*a* appearing in (15-1) corresponds to data to be written to page 0 in the flash memory 6*a* of group A, and data 0*b* appearing in (15-1) corresponds to data to be written to page 0 in the flash memory 6*b* of group B. Similarly, data 1*a*, 2*a* and 3*a* appearing in (15-1) correspond to data to be written to page 1, page 2 and page 3 in the flash memory 6*a*. Similarly, data 1*b*, 2*b* and 3*b* appearing in (15-1) correspond to data to be written to page 1, page 2 and page 3 in the flash memory 6*b*. Then, data 0*a*, 0*b*, 1*a*, and 1*b* for four pages in total are previously written to the data memory 4 (i.e., a memory full state), and thereafter, data 0*a* for one page is transferred to the flash memory 6*a*.

After the transfer is completed, the next data 0*b* for one page is transferred to the flash memory 6*b* to be successively written.

The sequencer activation timer 3*c* causes the flash control sequencer 7*a* (7*b*) connected to the flash memory 6*a* (6*b*) to operate, and at the same time, sets a timer value to a predetermined value to start count down. The timer value is set to T1 (first predetermined time) if the write-target record page is the 1st record page; set to T2 (second predetermined time) if the write-target record page is the 2nd record page; and set to T3 (third predetermined time) if the write-target record page is the 3rd record page. Every time writing data to each record page is started, the sequencer activation timer 3*c* activates the timer 3*c* simultaneously with the start, whereby the two flash memories 6*a* (6*b*) undergo the alternate write operation with a time-base offset.

In writing data 0*a* to the first record page 0 of AU, the flash control sequencer 7*a* is activated, and at the same time, having the timer value set to T1 because the write page corresponds to the 1st record page, the sequencer activation timer 3*c* is operated to count down. Then, the flash control sequencer 7*a* reads data from the data memory 4, and transfers data of the first page to the data cache 61*a* of the flash memory 6*a* (data 0*a* of (15-2)).

When the timer value reaches 0, the flash control sequencer 7*b* is activated, and at the same time, having the timer value set to T1 because the write page corresponds to the 1st record page, the sequencer activation timer 3*c* is operated to count down. Then, the flash control sequencer 7*b* reads data from the data memory 4, and transfers data of the first page to the data cache 61*b* of the flash memory 6*b* (data 0*b* of (15-3)).

Next, When the timer value reaches 0 and if the flash memory 6*a* is ready (i.e., in a state Where transfer to the data cache is possible), the flash control sequencer 7*a* is activated, and at the same time, having the timer value set to T2 because the write page corresponds to the 2nd record page, the sequencer activation timer 3*c* is operated to count down. Then, the flash control sequencer 7*a* reads data from the data memory 4, and transfers data of page 1 to the data cache 61*a* of the flash memory 6*a* (data 1*a* of (15-2)).

Next, when the timer value reaches 0 and if the flash memory 6*b* is ready (i.e., in a state where transfer to the data cache is possible), the flash control sequencer 7*b* is activated, and at the same time, having the timer value set to T2 because the write page corresponds to the 2nd record page, the sequencer activation timer 3*c* is operated to count down. Then, the flash control sequencer 7*b* reads data from the data memory 4, and transfers data of page 1 to the data cache 61*b* of the flash memory 6*b* (data 1*b* of (15-3)).

Next, when the timer value reaches 0 and if the flash memory 6*a* is ready (i.e., in a state where transfer to the data cache is possible), the flash control sequencer 7*a* is activated, and at the same time, having the timer value set to T3 because the write page corresponds to the 3rd record page, the sequencer activation timer 3*c* is operated to count down. Then, the flash control sequencer 7*a* reads data from the data memory 4, and transfers data of page 2 to the data cache 61*a* of the flash memory 6*a* (data 2*a* of (15-2)).

Next, when the timer value reaches 0 and if the flash memory 6*b* is ready (i.e., in a state where transfer to the data cache is possible), the flash control sequencer 7*b* is activated, and at the same time, having the timer value set to T3 because the write page corresponds to the 3rd record page, the sequencer activation timer 3*c* is operated to count down. Then, the flash control sequencer 7*b* reads data from the data memory 4, and transfers data of page 2 to the data cache 61*b* of the flash memory 6*b* (data 2*b* of (15-3)).

In this manner, every time the sequencer activation timer 3*c* activates the flash control sequencers 7*a* and 7*b*, the sequencer activation timer 3*c* sets the timer value to one of the first predetermined time (T1), the second predetermined time (T2), and the third predetermined time (T3) in accordance with the write speed of the write target record page, to count down the timer value. Because the setting of the timer value is carried out simultaneously with the activation of the flash control sequencer 7*a* (7*b*), the setting of the timer value enters a wait state if the flash memory 6*a* (6*b*) connected to the flash control sequencer 7*a* (7*b*) is in a busy state (i.e., in a state where transfer to the data cache is impossible).

Next, a description will be given of (15-4) and (15-5) in FIG. 15. (15-4) is a timing diagram of writing of data transferred from the data cache 61*a* of the flash memory 6*a* to the flash cell array 63*a*, Wherein the reference characters 0*a*, 1*a*, 2*a*, and 3*a* denote writing data of page 0, page 1, page 2, and page 3 of the flash memory 6*a* to the flash cell array 63*a*. (15-5) is a timing diagram of writing of data transferred from the data cache 61*b* of the flash memory 6*b* to the flash cell array 63*b*, wherein the reference characters 0*b*, 1*b*, 2*b*, and 3*b* denote writing data of page 0, page 1, page 2, and page 3 of the flash memory 6*b* to the flash cell array 63*b*.

In this manner, in the present embodiment, data transfer is carried out by interleaving data in the two flash memory groups for each record page, and control is performed over two flash control sequencers 7*a* (7*b*) by driving the sequencer activation timer 3*c* in accordance with the three standard values of write time of respective record pages, such that only one flash memory 6*a* (6*b*) is programming (writing data) when timer 3*c* is in operation. Thus, the power consumption can be suppressed.

(Fifth Embodiment)

In the present embodiment, a description will be given of an exemplary application to 3-bit per cell flash memories similarly to the fourth embodiment.

In the fourth embodiment, interleaving data is carried out in two flash memory groups for each page, and control is performed over sequencers by setting the timer to T1 at the start of writing data to the 1st record page; setting the timer to T2 at the start of writing data to the 2nd record page; and setting the timer to T3 at the start of writing data to the 3rd record page.

In contrast, in the present embodiment, interleaving data is carried out in two flash memory groups every two pages, wherein the two pages are the 1st record page and the 2nd record page, or for each page wherein the page is the 3rd record page. Specifically, interleaving data is carried out every two pages wherein the two pages are the 1st record page and the 2nd record page, and thereafter, interleaving data is carried out for each page wherein the one page is the 3rd record page, and further thereafter, interleaving data is carried out every two pages wherein the two pages are the 1st record page and the 2nd record page. In this manner, interleaving data is carried out alternately every two pages, for each page, every two pages, and for each page. Further, the timer is set to T1+T2 at the start of writing data of the 1st record page and 2nd record page, and the timer is set to T3 at the start of writing data of the 3rd record page, to control the sequencers.

Here, the capacity of an internal buffer of each flash memory of the present embodiment is not large enough to continuously record the three record pages of T1+T2+T3. Hence, the number of page to be continuously recorded in one flash memory is set to 2 page; the 1st record page and the 2nd record page are handled together while having the timer value corresponding thereto set to (T1+T2); and the timer value corresponding to 3rd record page is set to T3.

The semiconductor storage device according to the present embodiment is structured similarly to that of the first embodiment shown in FIG. 1 and, therefore, the description thereof is not repeated herein.

A description will be given of a write operation according to the present embodiment, referring to FIG. 16.

Figure 16:
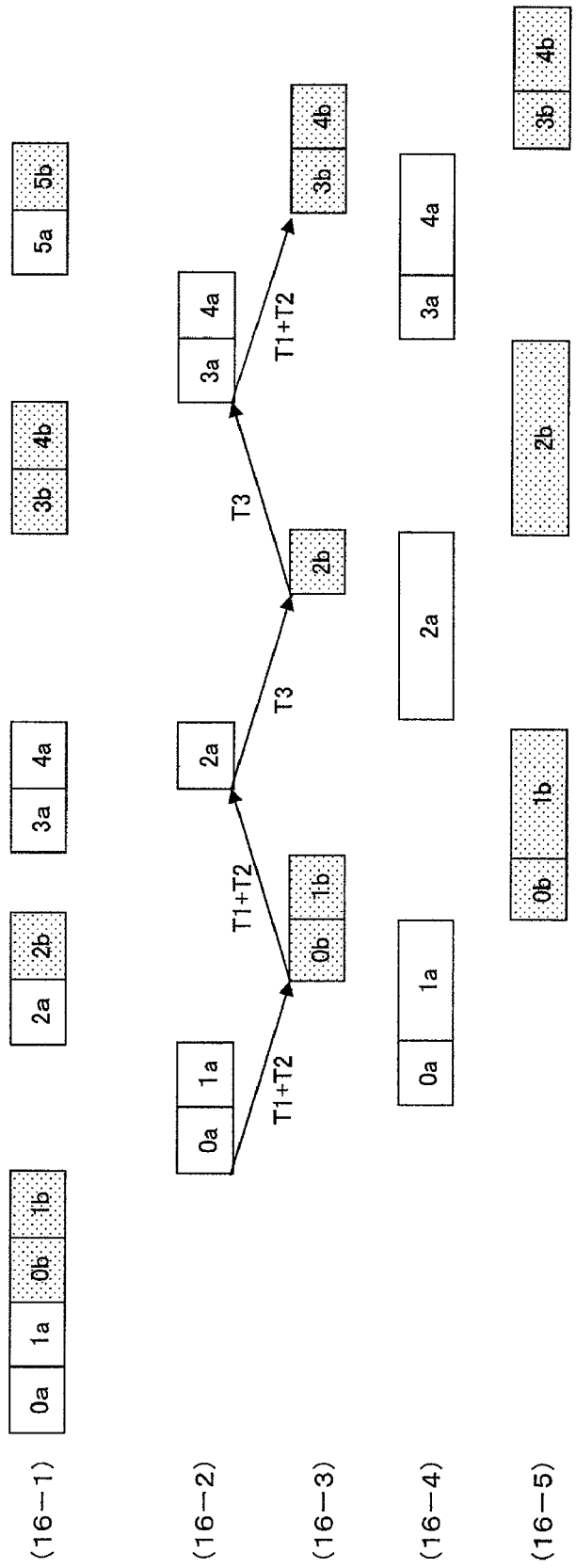
FIG. 16 shows a timing diagram (at a standard write speed) of substantial parts according to a fifth embodiment.

FIG. 16 shows a timing diagram of each part in a write operation mode in the present embodiment, and shows a case where the write time of the flash memory 6a (6b) is a standard value. Here, the standard value of the write time is the expected write time with no conditions that hinder writing data. In the flash memory 6a (6b), the standard value of the write time of the 1st record page is T1; the standard value of the write time of the 2nd record page is T2; and the standard value of the write time of the 3rd record page is T3 (T3>T2>T1).

In FIG. 16, (16-1) represents write timing to the data memory 4; (16-2) represents transfer timing to the data cache 61a of the flash memory 6a; (16-3) represents transfer timing to the data cache 61b of the flash memory 6b; (16-4) represents write timing to the flash cell array 63a of the flash memory 6a; and (16-5) represents write timing to the flash cell array 63b of the flash memory 6b. The data transfer amount is equal to the record page size, i.e., 4 KB.

A command received via the external interface unit 1 has its contents analyzed by the command analysis unit 2. In a case where the command is a write command that matches with the AU alignment, as shown in (16-1), data is sequentially written from the host device to the data memory 4. Data 0a appearing in (16-1) corresponds to data to be written to page 0 in the flash memory 6a of group A, and data 0b appearing in (16-1) corresponds to data to be written to page 0 in the flash memory 6b of group B. Similarly, data 1a, 2a and 3a appearing in (16-1) correspond to data to be written to page 1, page 2 and page 3 in the flash memory 6a. Similarly, data 1b, 2b and 3b appearing in (16-1) correspond to data to be written to page 1, page 2 and page 3 in the flash memory 6b. Then, data 0a, 1a, 0b, and 1b for four pages in total are previously written to the data memory 4 (i.e., a memory full state), and thereafter, data 0a and 1a for two pages are transferred to the flash memory 6a. After the transfer is completed, the next data 0b and 1b for two pages are transferred to the flash memory 6b to be successively written.

The sequencer activation timer 3c causes the flash control sequencer 7a (7b) connected to the flash memory 6a (6b) to operate, and at the same time, sets a timer value to a predetermined value to start count down. The timer value is set to T1+T2 if the write-target record pages are the 1st record page and the 2nd record page to be continuously written to an identical flash memory, and set to T3 (third predetermined time) if the write-target record page is the 3rd record page. Every time writing data to each record page is started, the sequencer activation timer 3c activates the timer 3c simultaneously with the start, whereby the two flash memories 6a (6b) undergo the alternate write operation with a time-base offset.

In writing data 0a to the first record page 0 of AU, the flash control sequencer 7a is activated, and at the same time, having the timer value set to T1+T2 because the write pages correspond to both the 1st record page and the 2nd record page and the 1st record page and the 2nd record page are continuously recorded, the sequencer activation timer 3c is operated to count down. Then, the flash control sequencer 7a reads data from the data memory 4, and transfers data of the first page and the next page (corresponding to the 1st record page and the 2nd record page) to the data cache 61a of the flash memory 6a (data 0a and 1a of (16-2)).

When the timer value reaches 0, the flash control sequencer 7b is activated, and at the same time, having the timer value set to T1+T2 because the write pages correspond to both the 1st record page and the 2nd record page and the 1st record page and the 2nd record page are continuously recorded, the sequencer activation timer 3c is operated to count down. Then, the flash control sequencer 7b reads data from the data memory 4, and transfers data of the first page and the next page (corresponding to the 1st record page and the 2nd record page) to the data cache 61b of the flash memory 6b (data 0b and 1b of (16-3)).

Next, when the timer value reaches 0 and if the flash memory 6a is ready (i.e., in a state where transfer to the data cache is possible), the flash control sequencer 7a is activated, and at the same time, having the timer value set to T3 because the write page corresponds to the 3rd record page, the sequencer activation timer 3c is operated to count down. Then, the flash control sequencer 7a reads data from the data memory 4, and transfers data of page 1 to the data cache 61a of the flash memory 6a (data 2a of (16-2)).

When the timer value reaches 0 and if the flash memory 6b is ready (i.e., in a state where transfer to the data cache is possible), the flash control sequencer 7b is activated, and at the same time, having the timer value set to T3 because the write page corresponds to the 3rd record page, the sequencer activation timer 3c is operated to count down. Then, the flash control sequencer 7b reads data from the data memory 4, and transfers data of page 1 to the data cache 61b of the flash memory 6b (data 2b of (16-3)).

In this manner, every time the sequencer activation timer 3c activates the flash control sequencers 7a and 7b, the sequencer activation timer 3c sets the timer value to one of the sum of the first predetermined time and the second predetermined time (T1+T2) or the third predetermined time (T3) in accordance with the standard value of the write time of the one record page or two record pages, to count down the timer value. Because the setting of the timer value is carried out simultaneously with the activation of the flash control sequencer 7a (7b), the setting of the timer value enters a wait state if the flash memory 6a (6b) connected to the flash control sequencer 7a (7b) is in a busy state (i.e., in a state where transfer to the data cache is impossible).

Next, a description will be given of (16-4) and (16-5) in FIG. 16. (16-4) is a timing diagram of writing of data transferred from the data cache 61a of the flash memory 6a to the flash cell array 63a, wherein the reference characters 0a, 1a, 2a, and 3a denote writing data of page 0, page 1, page 2, and page 3 of the flash memory 6a to the flash cell array 63a. (16-5) is a timing diagram of writing of data transferred from the data cache 61b of the flash memory 6b to the flash cell array 63b, wherein the reference characters 0b, 1b, 2b, and 3b denote writing data of page 0, page 1, page 2, and page 3 of the flash memory 6b to the flash cell array 63b.

In this manner, in the present embodiment, data transfer is carried out by interleaving data in the two flash memory groups for each record page, or every two continuous record pages basis, and control is performed over two flash control sequencers 7a (7b) by driving the sequencer activation timer 3c in accordance with the standard value of the write time of the one interleaved record page or that of the two interleaved record pages, such that only one flash memory 6a (6b) is programming (writing data) when timer 3c is in operation. Thus, the power consumption can be suppressed.

Note that, in the present embodiment, while the timer value is set to be two timer values of T1+T2 and T3, it goes without saying that one timer value will suffice when time T1+T2 and time T3 are approximately equivalent.

In the foregoing, in the present embodiment, the description has been given of the four-level flash memories or the eight-level flash memories, it is not limited thereto, and it goes without saying that it is applicable to two-level flash memories, and further multilevel flash memories.

Further, while the description has been given of the case where the time required by writing data of the record page is classified into three types of the 1st record page, the 2nd record page and the 3rd record page, it goes without saying that the time may be classified into more than three types.

Still further, in the present embodiment, while the description has been given of the structure of two flash memory groups, it goes without saying that it is applicable to equal to or more than three flash memory groups.

INDUSTRIAL APPLICABILITY

The semiconductor storage device according to the present embodiment relates to a semiconductor storage device such as a memory card, which guarantees fast recording speed and, additionally, is capable of suppressing the power consumption. Therefore, it is highly possible for the semiconductor storage device to be employed for professional use where high-rate recording of moving images is required.

What is claimed is:

1. A semiconductor storage device, comprising:
a plurality of flash memories; and
a controller for the flash memories, wherein
    each of the flash memories includes a data cache operable to hold data for at least one record page in writing,
    each of the flash memories includes a plurality of erasure blocks each having a plurality of record pages,
    each of the record pages is classified into a first record page and a second record page of which write time is longer than a write time of the first record page, and
the controller for the flash memories is configured to:
    register alignment information on the plurality of record pages divide the plurality of flash memories into at least two groups;
    perform write control for each record page by interleaving data between the groups;
    determine whether a page to be written data is the first record page or the second record page based on the alignment information; and
    when it is determined that the page to be written data is the first record page, after a lapse of a first predetermined time from start of writing data of one of the groups, the controller starts writing data of another one of the groups, and
    when it is determined that the page to be written data is the second record page, after a lapse of a second predetermined time being longer than the first predetermined time from start of writing data of one of the groups, the controller starts writing data of another one of the groups.

2. The semiconductor storage device according to claim 1, wherein
    when the number of the groups is two,
    the first predetermined time is set to be equal to or smaller than half a maximum value of the write time to the first record page in the flash memories, and
    the second predetermined time is set to be equal to or smaller than half a maximum value of the write time to the second record page in the flash memories.

3. The semiconductor storage device according to claim 1, wherein
    when the number of the groups is two,
    the first predetermined time is set to be longer than a standard value of the write time to the first record page in the flash memories, and
    the second predetermined time is set to be longer than a standard value of the write time to the second record page in the flash memories.

4. The semiconductor storage device according to claim 2, wherein
    when the number of the groups is two,
    the first predetermined time is set to be longer than a standard value of the write time to the first record page in the flash memories, and
    the second predetermined time is set to be longer than a standard value of the write time to the second record page in the flash memories.

5. A semiconductor storage device, comprising:
a plurality of flash memories; and
a controller for the flash memories, wherein
    each of the flash memories includes a data cache operable to hold data for at least one record page in writing,
    each of the flash memories includes a plurality of erasure blocks each having a plurality of record pages,
    different pages within a same erasure block have a different write time,
    the controller for the flash memories is configured to:
        divide the plurality of flash memories into at least two flash memory groups;
        group the plurality of record pages into a plurality of record page groups;
        perform write control for each record page group by interleaving data between the flash memory groups; and
        after a lapse of a write time for a group of a record page to be written data among the record page groups, starts writing data of another one of the flash memory groups.

6. The semiconductor storage device according to claim 5, wherein each of the flash memories can write a plurality of bits in one cell.

7. The semiconductor storage device according to claim 6, wherein
    each of the flash memories includes a plurality of erasure blocks in which three record pages share one cell, and
    the controller for the flash memories groups the three record pages into a group including two record pages and a group including one record page.

* * * * *